(12) United States Patent
Yamamoto et al.

(10) Patent No.: US 7,100,104 B2
(45) Date of Patent: Aug. 29, 2006

(54) TURBO DECODER, TURBO ENCODER AND RADIO BASE STATION WITH TURBO DECODER AND TURBO ENCODER

(76) Inventors: Yukio Yamamoto, c/o Hitachi, Ltd., Intellectual Property Group, New Marunouchi Bldg. 5-1, Marunouchi 1-chome, Chiyoda-ku, Tokyo 100-8220 (JP); Shiro Mazawa, c/o Hitachi, Ltd., Intellectual Property Group, New Marunouchi Bldg. 5-1, Marunouchi 1-chome, Chiyoda-ku, Tokyo (JP) 100-8220; Takao Inoue, c/o Hitachi, Ltd., Intellectual Property Group, New Marunouchi Bldg. 5-1, Marunouchi 1-chome, Chiyoda-ku, Tokyo (JP) 100-8220

( * ) Notice: Subject to any disclaimer, the term of this patent is extended or adjusted under 35 U.S.C. 154(b) by 468 days.

(21) Appl. No.: 10/352,060

(22) Filed: Jan. 28, 2003

(65) Prior Publication Data

US 2003/0177432 A1    Sep. 18, 2003

(30) Foreign Application Priority Data

Mar. 12, 2002    (JP)    ............................. 2002-066296

(51) Int. Cl.
*H00M 13/03* (2006.01)
(52) U.S. Cl. .................................................. 714/786
(58) Field of Classification Search ................ 714/752, 714/755, 786, 746
See application file for complete search history.

(56) References Cited

U.S. PATENT DOCUMENTS

| | | | | |
|---|---|---|---|---|
| 6,484,283 B1 * | 11/2002 | Stephen et al. | ............. | 714/786 |
| 6,516,437 B1 * | 2/2003 | Van Stralen et al. | ........ | 714/755 |
| 6,574,766 B1 * | 6/2003 | Obuchi et al. | ............... | 714/755 |
| 6,721,908 B1 * | 4/2004 | Kim et al. | ................... | 714/702 |
| 6,789,218 B1 * | 9/2004 | Edmonston et al. | ........ | 714/701 |
| 6,845,482 B1 * | 1/2005 | Yao et al. | ................... | 714/755 |
| 6,912,684 B1 * | 6/2005 | Miyata et al. | ............... | 714/776 |
| 2003/0148780 A1 * | 8/2003 | Takano | ....................... | 455/522 |

FOREIGN PATENT DOCUMENTS

JP    2001-53624    2/2001

OTHER PUBLICATIONS

"cdma 2000 High Rate Packet Data Air Interface Specification", pp. 9-43 to 9-44, 3GPP2, C.S0024 (Version 2.0), Oct. 27, 2000.

* cited by examiner

*Primary Examiner*—Shelly Chase
(74) *Attorney, Agent, or Firm*—Mattingly, Stanger, Malur & Brundidge, P.C.

(57) ABSTRACT

An error correction decoding unit performs error correction decoding of an inputted data series. A first memory is written with the data series subjected to error correction decoding by the error correction decoding unit. When the data series undergoing error correction decoding is written to the first memory, an address generator supplies write addresses and when the data series written to the first memory is read out of the first memory at random, the address generator supplies random read addresses.

28 Claims, 16 Drawing Sheets

FIG. 3

| N' = 250 | | N' = 506 | | N' = 1018 | | N' = 2042 | | N' = 4090 | |
|---|---|---|---|---|---|---|---|---|---|
| SYMBOL NUMBER | ADDRESS | SYMBOL NUMBER | ADDRESS | SYMBOL NUMBER | ADDRESS | SYMBOL NUMBER | ADDRESS | SYMBOL NUMBER | ADDRESS |
| 31 | 251 | 63 | 506 | 63 | 1018 | 863 | 2043 | 1599 | 4090 |
| 63 | 254 | 95 | 511 | 223 | 1019 | 927 | 2045 | 2015 | 4091 |
| 127 | 252 | 191 | 510 | 383 | 1020 | 991 | 2047 | 2431 | 4092 |
| 159 | 255 | 287 | 509 | 543 | 1021 | 1855 | 2042 | 2847 | 4093 |
| 191 | 250 | 383 | 508 | 703 | 1022 | 1919 | 2044 | 3263 | 4094 |
| 223 | 253 | 479 | 507 | 863 | 1023 | 1983 | 2046 | 3679 | 4095 |

FIG. 5

| INPUT SERIES (501) | INPUT SYMBOL NUMBER (502) | INTERLEAVE WRITE ADDRESS (503) | OUTPUT SYMBOL NUMBER (504) | ADDRESS CONVERSION SECTION OUTPUT (505) | INTERLEAVE READ ADDRESS (506) | OUTPUT SERIES (507) | |
|---|---|---|---|---|---|---|---|
| D0 | 0 | 0 | 0 | 1 | – | – | ⎫ |
| D1 | 1 | 1 | 1 | 129 | – | – | ⎪ |
| D2 | 2 | 2 | 2 | 67 | – | – | ⎬ PRE-STAGE PROCESS |
| D3 | 3 | 3 | 3 | 197 | – | – | ⎪ |
| D4 | 4 | 4 | 4 | 33 | – | – | ⎪ |
| D5 | 5 | 5 | 5 | 165 | – | – | ⎪ |
| D6 | 6 | 6 | 6 | 97 | – | – | ⎭ |
| D7 | 7 | 7 | 7 | 229 | 1 | D1 | |
| D8 | 8 | 8 | 8 | 19 | 129 | D129 | |
| D9 | 9 | 9 | 9 | 149 | 67 | D67 | |
| ⋮ | ⋮ | ⋮ | ⋮ | ⋮ | ⋮ | ⋮ | |
| D30 | 30 | 30 | 30 | 125 | 237 | D237 | |
| D31 | 31 | 31 | 31 | 251 | 25 | D25 | |
| D32 | 32 | 32 | 32 | 2 | 157 | D157 | |
| D33 | 33 | 33 | 33 | 130 | 89 | D89 | |
| D34 | 34 | 34 | 34 | 70 | 221 | D221 | |
| D35 | 35 | 35 | 35 | 194 | 59 | D59 | |
| D36 | 36 | 36 | 36 | 34 | 189 | D189 | BECAUSE OF DELETION OF 251 INSIDE CUSTODIAL MEMORY, 2 IS DELIVERED |
| D37 | 37 | 37 | 37 | 162 | 125 | D125 | |
| D38 | 38 | 38 | 38 | 98 | 2 | D2 | |
| D39 | 39 | 39 | 39 | 226 | 130 | D130 | |
| ⋮ | ⋮ | ⋮ | ⋮ | ⋮ | ⋮ | ⋮ | |
| D62 | 62 | 62 | 62 | 122 | 26 | D26 | |
| D63 | 63 | 63 | 63 | 254 | 154 | D154 | |
| D64 | 64 | 64 | 64 | 3 | 90 | D90 | |
| D65 | 65 | 65 | 65 | 131 | 218 | D218 | |
| D66 | 66 | 66 | 66 | 65 | 62 | D62 | |
| D67 | 67 | 67 | 67 | 199 | 186 | D186 | BECAUSE OF DELETION OF 254 INSIDE CUSTODIAL MEMORY, 3 IS DELIVERED |
| D68 | 68 | 68 | 68 | 35 | 122 | D122 | |
| D69 | 69 | 69 | 69 | 167 | 3 | D3 | |
| D70 | 70 | 70 | 70 | 99 | 131 | D131 | |
| ⋮ | ⋮ | ⋮ | ⋮ | ⋮ | ⋮ | ⋮ | |
| D222 | 222 | 222 | 222 | 123 | 61 | D61 | |
| D223 | 223 | 223 | 223 | 253 | 187 | D187 | BECAUSE OF DELETION OF 253 INSIDE CUSTODIAL MEMORY, 0 IS DELIVERED |
| D224 | 224 | 224 | 224 | 0 | 123 | D123 | |
| D225 | 225 | 225 | 225 | 128 | 0 | D0 | |
| ⋮ | ⋮ | ⋮ | ⋮ | ⋮ | ⋮ | ⋮ | |
| D248 | 248 | 248 | 248 | 24 | 232 | D232 | |
| D249 | 249 | 249 | 249 | 152 | 24 | D24 | |
| | | | 250 | 88 | 152 | D152 | |
| | | | 251 | 216 | 88 | D88 | |
| | | | 252 | 56 | 216 | D216 | |
| | | | 253 | 184 | 56 | D56 | |
| | | | 254 | 120 | 184 | D184 | |
| | | | 255 | 248 | 120 | D120 | |
| | | | | | 248 | D248 | ← READ |

FIG. 8

| INPUT SERIES (501) | INPUT SYMBOL NUMBER (502) | INTERLEAVE WRITE ADDRESS (503) | ADDRESS CONVERSION SECTION 33 INTPUT (801) | ADDRESS CONVERSION SECTION 33 OUTPUT (802) | ADDRESS CONVERSION SECTION 34 INTPUT (803) | ADDRESS CONVERSION SECTION 34 OUTPUT (804) | INTERLEAVE READ ADDRESS (805) | OUTPUT SERIES (806) |
|---|---|---|---|---|---|---|---|---|
| D0 | 0 | 0 | 0 | 1 | 1 | 129 | 1 | D1 |
| D1 | 1 | 1 | 1 | 129 | 2 | 67 | 129 | D129 |
| D2 | 2 | 2 | 2 | 67 | 3 | 197 | 67 | D67 |
| ⋮ | ⋮ | ⋮ | ⋮ | ⋮ | ⋮ | ⋮ | ⋮ | ⋮ |
| D30 | 30 | 30 | 30 | 125 | 31 | 251 | 125 | D125 |
| D31 | 31 | 31 | 31 | 251 | 32 | 2 | 2 | D2 |
| D32 | 32 | 32 | 33 | 130 | 34 | 70 | 130 | D130 |
| D33 | 33 | 33 | 34 | 70 | 35 | 194 | 70 | D70 |
| ⋮ | ⋮ | ⋮ | ⋮ | ⋮ | ⋮ | ⋮ | ⋮ | ⋮ |
| D247 | 247 | 247 | 253 | 184 | 254 | 120 | 184 | D184 |
| D248 | 248 | 248 | 254 | 120 | 255 | 248 | 120 | D120 |
| D249 | 249 | 249 | 255 | 248 | 0 | 1 | 248 | D248 |

FIG. 12

| INPUT SERIES (501) | INPUT SYMBOL NUMBER (502) | INTERLEAVE WRITE ADDRESS (503) | OUTPUT SYMBOL NUMBER (504) | INTERLEAVE READ ADDRESS (1201) | OUTPUT SERIES (1202) | |
|---|---|---|---|---|---|---|
| D0 | 0 | 0 | 0 | 1 | D1 | |
| D1 | 1 | 1 | 1 | 129 | D129 | |
| D2 | 2 | 2 | 2 | 67 | D67 | |
| ⋮ | ⋮ | ⋮ | ⋮ | ⋮ | ⋮ | |
| D30 | 30 | 30 | 30 | 125 | D125 | |
| D31 | 31 | 31 | 31 | 125 | D125 | ← PROCESS STOP |
| D32 | 32 | 32 | 32 | 2 | D2 | |
| ⋮ | ⋮ | ⋮ | ⋮ | ⋮ | ⋮ | |
| D62 | 62 | 62 | 62 | 122 | D122 | |
| D63 | 63 | 63 | 63 | 122 | D122 | ← PROCESS STOP |
| D64 | 64 | 64 | 64 | 3 | D3 | |
| ⋮ | ⋮ | ⋮ | ⋮ | ⋮ | ⋮ | |
| D222 | 222 | 222 | 222 | 123 | D123 | |
| D223 | 223 | 223 | 223 | 123 | D123 | ← PROCESS STOP |
| D224 | 224 | 224 | 224 | 0 | D0 | |
| ⋮ | ⋮ | ⋮ | ⋮ | ⋮ | ⋮ | |
| D249 | 249 | 249 | 249 | 152 | D152 | |
| | | | 250 | 88 | D88 | |
| | | | 251 | 216 | D216 | |
| | | | 252 | 56 | D56 | |
| | | | 253 | 184 | D184 | |
| | | | 254 | 120 | D120 | |
| | | | 255 | 248 | D248 | |

TURBO DECODER, TURBO ENCODER AND RADIO BASE STATION WITH TURBO DECODER AND TURBO ENCODER

BACKGROUND OF THE INVENTION

The present invention relates to a turbo encoder and a turbo decoder for receiving coded data and decoding it while performing error correction and a radio base station provided with the turbo encoder and decoder.

In the next generation radio communication, communication is carried out using turbo coding in order to have the ability to withstand random and bust noises. In the turbo coding, a packet string (data series) X1 . . . Xn is generated by convolutionally coding data Xs and another packet string (data series) Y1 . . . Ym is generated by convolutionally coding data Ys which is changed in order in accordance with a predetermined rule described in "cdma 2000 High Rate Packet Data Air Interface Specification", pages 9–43 to 9–44, 3GPP2, C.S0024 (Version 2.0) published on Oct. 27, 2000 (hereinafter referred to as reference 1). Communication is done by transmitting and receiving (coding/decoding) these packet strings. Conversion of the order or sequence of the data series is called interleave and inverse conversion is called de-interleave.

Reference 1 discloses a method for the interleave and its FIG. 9.2.1.3.4.2.3-1 depicts a method of generating addresses for write/read of a data series to/from a memory and a method of making correction or recalculation in order to perform interleave. For example, where the data length of a data series is N (bits) and the data length of the data series removed of tail bits is N' (bits), a data series having a data length N'=250 can be interleaved by issuing sequential addresses of from 0 to 249 by means of a counter and sequentially writing the data series to the memory. In the reference 1, however, random read addresses for the memory are calculated pursuant to the rule in reference 1 through a special method in order to maintain the ability to withstand noises. According this calculation method, addresses such as 251, 254 and so on at which data do not exist on the memory are calculated and therefore, correction or recalculation is carried out in the reference 1.

Accordingly, when realizing the address generator, it is necessary to provide the address correction function so as to regenerate addresses for read from the memory. When the address regeneration process such as above is carried out, the process for address generation becomes complicated in structure and superfluous processing time is needed, thus increasing delay in processing in the turbo decoder.

Generally, when concretely constructing the address generator, with fulfillment of correction in mind, corrected read addresses are tabulated in advance and read addresses calculated in reference 1 and the table as above are consulted to provide correct read addresses. For example, a technique described in JP-A-2001-53624 (hereinafter referred to as reference 2) adopts a method of storing addresses for write/read of data of the interleaver/de-interleaver in a memory.

SUMMARY OF THE INVENTION

The turbo encoder and decoder in the aforementioned reference 2 need to have interleave read addresses or de-interleave write addresses on the memory. The memory for address storage as above requires a capacity as below. When the data length N of data series is 256, the memory capacity is 8×256=2048 bits. With the data length N of data series being 512, the memory capacity is 9×512=4608 bits. With the data length N of data series being 1024, the memory capacity is 10×1024=10240 bits. With the data length N of data series being 2048, the memory capacity is 11×2048=22528 bits. With the data length N of data series being 3072, the memory capacity is 12×3072=36864 bits. With the data length N of data series being 4096, the memory capacity is 12×4096=49152. As will be seen from the above, in the turbo encoder and decoder of the reference 2, the memory is needed which can store all addresses corresponding to the aforementioned individual data lengths of data series, so that the circuit scale is increased to cause power consumption to increase.

Further, depending on the type of communication system, there is available a scheme which changes the data transmission speed in accordance with communication states. In the scheme changing the data transmission speed in accordance with the communication states, the data transmission speed in an upward circuit is variable, for example, at 5 steps between 9.6 kilobits/sec. and 153.6 kilobits/sec. and the data transmission speed in a downward circuit is variable, for example, at 12 steps between 38.4 kilobits/sec. and 2457.6 kilobits/sec. In this case, the data length N of a data series undergoing interleave/de-interleave differs with the respective data transmission speeds in the upward and downward circuits. For example, when the data transmission speed in the upward circuit is 9.6 kilobits/sec., the data length N of data series is 256 and as the data transmission speed changes, the data length N of data series is changed to 512, 1024, 2048 and 4096. Also, when the data transmission speed in the downward circuit is 38.4 kilobits/sec., the data length N of data series is 1024 and as the data transmission speed changes, the data length N of data series is changed to 2048, 3072 and 4096.

Accordingly, when in the communication system of the type changing the data transmission speed, correspondence with all values of 1024, 2048, 3072 and 4096 of the data length N of data series is desired to be made, the turbo encoder in the reference 2 requires a memory capacity of 118784 bits in total. Similarly, when correspondence with all values of 256, 512, 1024, 2048 and 4096 of the data length N of data series is desired to be made, the turbo decoder in the reference 2 requires a memory capacity of 88576 bits in total. As will be seen from the above, each of the turbo encoder and decoder requires the memory for storage of addresses corresponding to all of the individual data series, with the result that the circuit scale increases drastically to cause much power consumption.

With the above related arts in mind, an object of the present invention is to provide a turbo encoder and a turbo decoder respectively having an interleave read address generator and a de-interleave write address generator which can be implemented in a small circuit scale as well and a radio base station having the turbo encoder and decoder.

Another object of the invention is to provide a turbo encoder and a turbo decoder which can realize a further reduced circuit scale and power consumption by sharing the interleave read address generator and de-interleave write address generator and a radio base station having the turbo encoder and decoder.

To accomplish the above objects, the present invention has means as below.

A radio base station of the invention has an antenna, a radio frequency processing unit, a baseband unit and a communication interface. The radio frequency processing unit is connected to the antenna and is, for example, a RF unit. The baseband unit is connected to the RF unit, having a turbo decoder. The communication interface is adapted to provide interface between the baseband unit and a communication network. The turbo decoder is adapted to decode coded data, having an error correction decoding unit, a first memory and an address generator. The error correction decoding unit applies error correction decoding to a data series inputted through the radio frequency processing unit. The first memory is, for example, an interleaver memory and is written with a data series subjected to error correction decoding by means of the error correction decoding unit. The address generator is, for example, an interleave address generator. When writing the data series undergoing error correction decoding, for example, an interleaver input series to the interleaver memory, the address generator supplies write addresses, for example, interleave write addresses. Also, when reading the data series written to the interleaver memory out of the interleaver memory at random, the interleave address generator supplies random read addresses, for example, interleave addresses. Further, the interleave address generator converts values pursuant to a predetermined rule into interleave addresses and decides whether or not an interleave read address corresponds to a data storage portion on the interleaver memory. The value pursuant to the predetermined rule referred to herein is, for example, an output symbol number. The decision referred to herein is to decide whether, for example, the interleave read address exceeds a bit number resulting from subtraction of tail bits from an information bit number of the interleaver input series.

When a decision result indicates that an interleave address corresponds to a data storage portion on the interleaver memory, the interleave address generator reads a data series written to the interleaver memory by using the interleave address. On the other hand, when an interleave address does not correspond to any data storage portion on the interleaver memory, the interleave address generator uses another interleave address substituting for that interleave address to randomly read a data series written to the interleaver memory, for example, an intereleaver output series.

Specifically, the interleave address generator has an address conversion section, a second memory and an address control section. The address conversion section converts an output symbol number into an interleave address. The second memory is, for example, a memory for keeping addresses in custody and stores the interleave addresses converted by the address conversion section. The address control section is, for example, a write/read address control section and controls writing of interleave addresses to the address custodial memory. The write/read address control section also controls reading of interleave addresses from the address custodial memory. When an interleave address does not correspond to any data storage portion on the interleaver memory, the write/read address control section overwrites the interleave address which has already been written to the address custodial memory with an interleave address immediately succeeding that written address. During a predetermined period following start of write to the interleaver memory, the write/read address control section stops reading an interleave address from the address custodial memory and after the predetermined period has elapsed, it starts reading an interleave address from the address custodial memory.

In another example, the interleave address generator has a plurality of address conversion sections, a correction section, an address decision (monitor) section and an address selection section. The correction section is, for example, a symbol number correction section and it delivers mutually different symbol numbers to respective ones of the plurality of address conversion sections. The address decision section decides whether interleave addresses converted by the respective ones of the plurality of address conversion sections correspond to data storage portions on the interleaver memory. The address selection section is, for example, a selector and it selects one of the interleave addresses converted by the respective ones of the plurality of address conversion sections in accordance with a decision result by the address decision section. In this case, each of the address conversion sections has priority and the selector selects, from interleave addresses so determined as to correspond to data storage portions on the interleaver memory, an interleave address converted by an address conversion section having higher priority. For example, an address conversion section having a smaller fixed value added to a symbol number is defined as having higher priority. An interleaver output series is read at random by using the selected interleave address.

In still another example, the interleave address generator has an address conversion section, an address decision section and an address control section. The address control section is, for example, a read address control section and it responds to a decision result by the address decision section to control reading of the interleaver output series to cause it to stop temporarily and besides processing of a peripheral circuit of the interleaver memory to cause it to stop temporarily.

The baseband unit of the radio base station of the present invention has a turbo encoder. The turbo encoder codes transmission data transmitted through the communication interface. Like the turbo decoder, the turbo encoder has an interleaver memory and an interleave address generator. The turbo encoder further has a convolutional encoder. The convolutional encoder performs convolutional coding of transmission data randomly read out of the interleaver memory.

Other objects, features and advantages of the invention will become apparent from the following description of the embodiments of the invention taken in conjunction with the accompanying drawings.

BRIEF DESCRIPTION OF THE DRAWINGS

FIG. 3 is a table useful to explain addresses which are generated pursuant to a rule in reference 1 and at which no data exist on a memory.

FIG. 5 is a table showing the relation among interleaver input series, interleave addresses and interleaver output series.

FIG. 8 is a table showing the relation among interlever input series, interleave addresses and interleaver output series.

FIG. 12 is a table showing the relation among interleaver input series, interleave addresses and interleaver output series in the invention.

DESCRIPTION OF THE EMBODIMENTS

Figure 1:
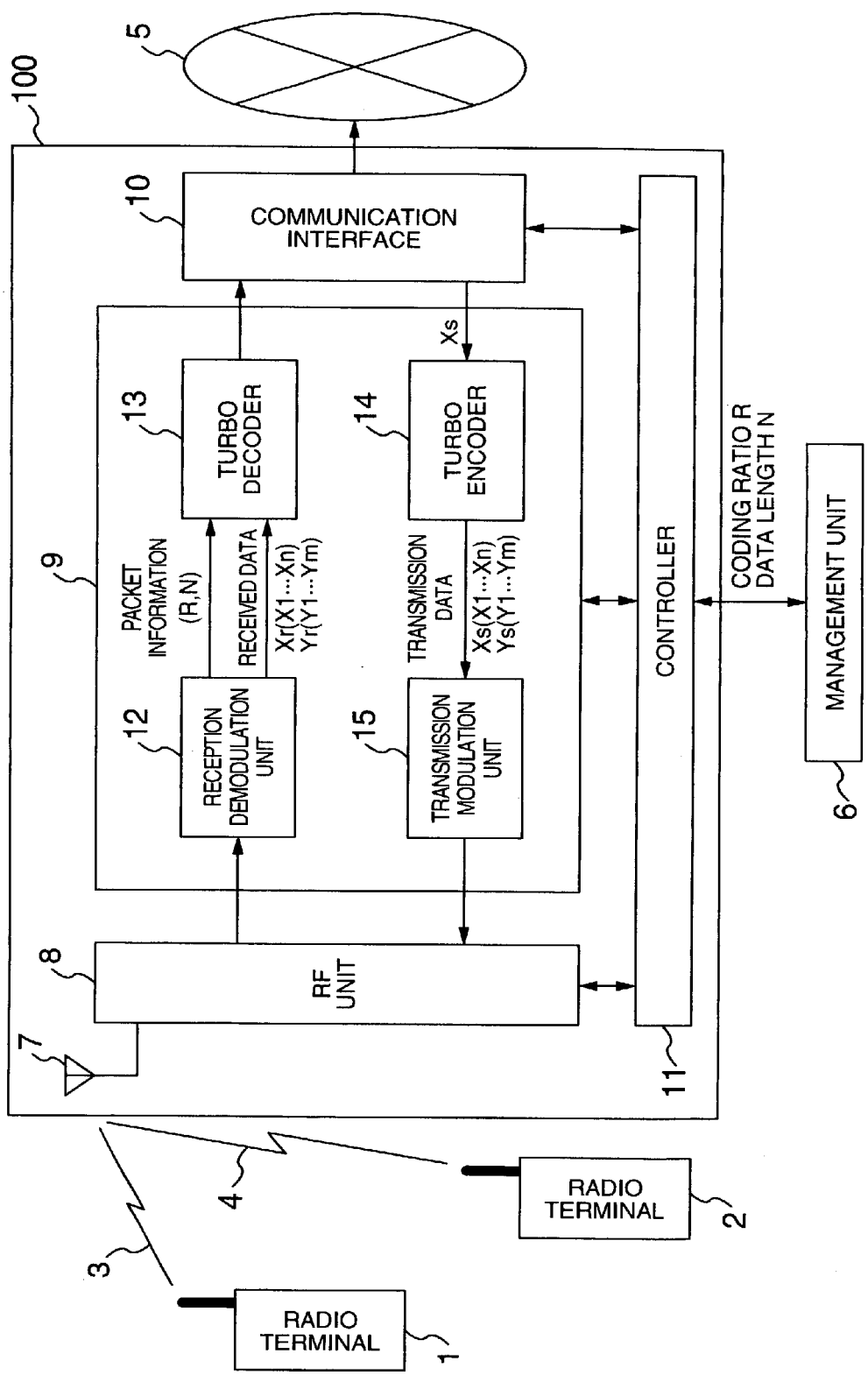
FIG. 1 is a block diagram showing an example of construction of the whole of a radio communication system including a radio base station provided with a turbo decoder and a turbo encoder in the present invention.

Embodiments of a turbo decoder, a turbo coder and a radio base station having these components according to the invention will now be detailed with reference to the accompanying drawings. In a description to be given hereinafter and respective drawings to be referred to hereinafter, constituent components having the same function are designated by the same reference numerals and will not be described repetitiously.

Referring first to FIG. 1, there is illustrated, in block form, an example of construction of the whole of a radio communication system comprising a radio base station including a turbo decoder and a turbo encoder according to the invention. The radio communication system comprises a radio base station 100, radio terminals 1, 2 and so on, radio circuits 3, 4 and so on, a communication network 5 for connecting the radio base station 100 to another communication apparatus, and a management unit 6 for managing and controlling the radio base station 100. The radio base station 100 of the present invention mutually communicates with the radio terminals 1 and 2 through the radio circuits 3 and 4. The radio base station 100 includes an antenna 7, a RF (radio frequency) unit 8 for performing transmission/reception of radio frequency, a baseband unit 9 for performing coding and decoding of data, a communication path interface 10 and a controller (CTRL) 11 for controlling the whole of the base station. More specifically, the baseband unit 9 is comprised of a reception demodulation unit 12 for performing a process of demodulating a series received from the terminal, a turbo decoder 13 for performing error correction decoding of received data Xr (data series X1 . . . Xn) and Yr (data series Y1 . . . Ym), where n and m are integers not less than 2, on the basis of packet information (for example, coding ratio R, data length N and the like), a turbo encoder 14 for performing error correction coding of data Xs (1≦s>n), and a transmission modulation unit 15 for preparing transmission signals of transmission data Xs (for data series X1 . . . Xn) and Ys (for data series Y1 . . . Ym). The packet information necessary for turbo coding and decoding contains the coding ratio R and data length N. Here, "data of packet information" corresponds to "information bits" and "data length N" corresponds to "information bit number". It is to be noted that the management unit 6 may sometimes be included in the radio base station 100 or alternatively a management unit (not shown) for the communication network 5 may sometimes act for this function.

Figure 2:
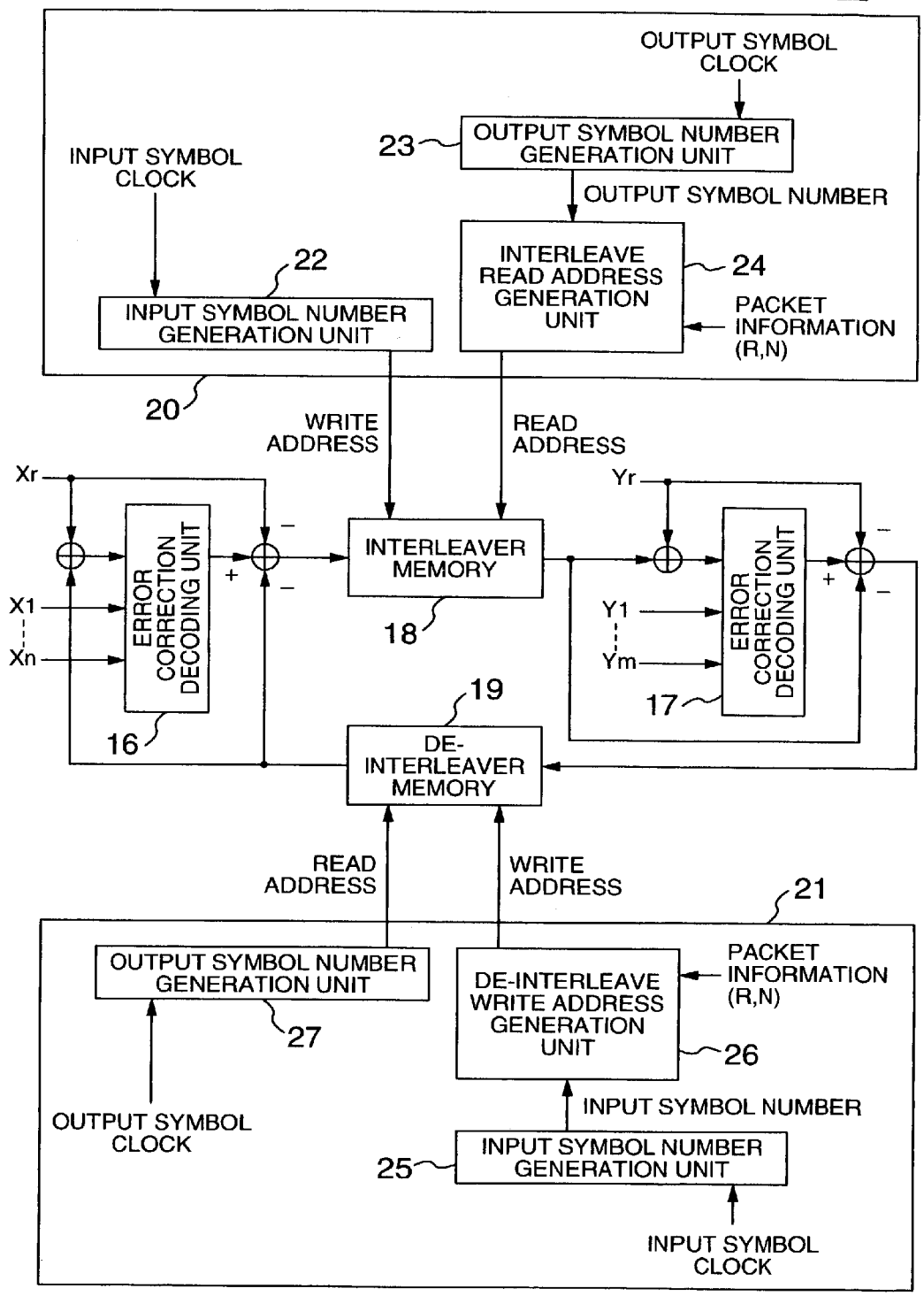
FIG. 2 is a block diagram showing an example of construction of the turbo decoder 13 in the present invention.

An example of construction of the turbo decoder 13 in the present invention is illustrated in block form in FIG. 2. The turbo decoder 13 includes an error correction decoding unit 16 for performing error correction decoding of the data series X1 . . . Xn obtained through convolutional coding of the data series Xr, an error correction decoding unit 17 for performing error correction decoding of the data series Y1 . . . Ym obtained through convolutional coding of the interleaved data series Yr, an interleaver memory 18 and a de-interleaver memory 19. The turbo decoder 13 further includes an interleave address generator and a de-interleave address generator 21.

The interleave address generator 20 manages addresses for write/read to/from the interleaver memory 18. An input symbol number generation unit 22 for generating addresses for write to the interleaver memory 18 receives an input symbol clock supplied externally and generates sequential input symbol numbers in accordance with the clock so as to generate interleave write addresses for writing the input series to the interleaver memory 18. An output symbol number generation unit 23 for delivering symbol numbers generated by a built-in counter receives an output symbol clock supplied externally, like the input symbol clock supplied to the input symbol number generation unit 22, and generates sequential output symbol numbers in accordance with the output symbol clock.

The interleave address generator 20, though its detailed construction and operation will be described later, generates random read addresses. Namely, an interleave read address generation unit 24 responds to an output symbol number generated by the output symbol number generation unit 23 to deliver an interleave read address which is calculated pursuant to the rule in reference 1 and at which data exist on the memory. Output symbol numbers generated here as well as interleave write addresses and interleave read addresses are processed in a unit of packet (data series X1 . . . Xn or Y1 . . . Ym).

The de-interleave address generator 21 manages addresses for write/read to/from the de-interleaver memory 19. An input symbol number generation unit 25 for delivering symbol numbers generated by a built-in counter receives an input symbol clock supplied externally and generates sequential numbers (input symbol numbers) in accordance with the clock. The de-interleave address generator 21, though its detailed construction and operation will be described later, generates random write addresses. Namely, a de-interleave write address generation unit 26 responds to an input symbol number generated by the input symbol number generation unit 25 to deliver a de-interleave write address which is calculated pursuant to the rule in reference 1 and at which data exists on the memory. An output symbol number generation unit 27 for generating addresses for read from the de-interleaver memory 19 receives an output symbol clock supplied externally, like the input symbol clock supplied to the input symbol number generation unit 25, generates sequential numbers in accordance with the clock and generates de-interleave read addresses for reading the data series stored in the de-interleaver memory 19. Input symbol numbers generated here as well as de-interleave write addresses and interleave read addresses are processed in a unit of packet (data series X1 . . . Xn or Y1 . . . Ym).

FIG. 3 is useful to explain addresses which are generated pursuant to the rule in reference 1 and at which data do not exist on the memory, the addresses being shown every data length N' of data series removed of a tail bit portion. The addresses referred to herein at which data do not exist on the memory are interleave addresses not corresponding to data storage portions on the interleaver memory 18. For example, when the data length N' of data series removed of a tail bit portion is 250, these addresses are 251, 254, 252 and so on. When the interleave addresses are generated pursuant to the rule in reference 1, interleave addresses not corresponding to any data storage portion on the interleaver memory 18 are also generated in correspondence with symbol numbers as shown in FIG. 3. In this case, since the addresses must be corrected or regenerated on the basis of the rule in reference 1 as has already been described, the address generation process is complicated in construction and besides superfluous processing time is needed, thus increasing delay in processing by the turbo decoder.

Figure 4:
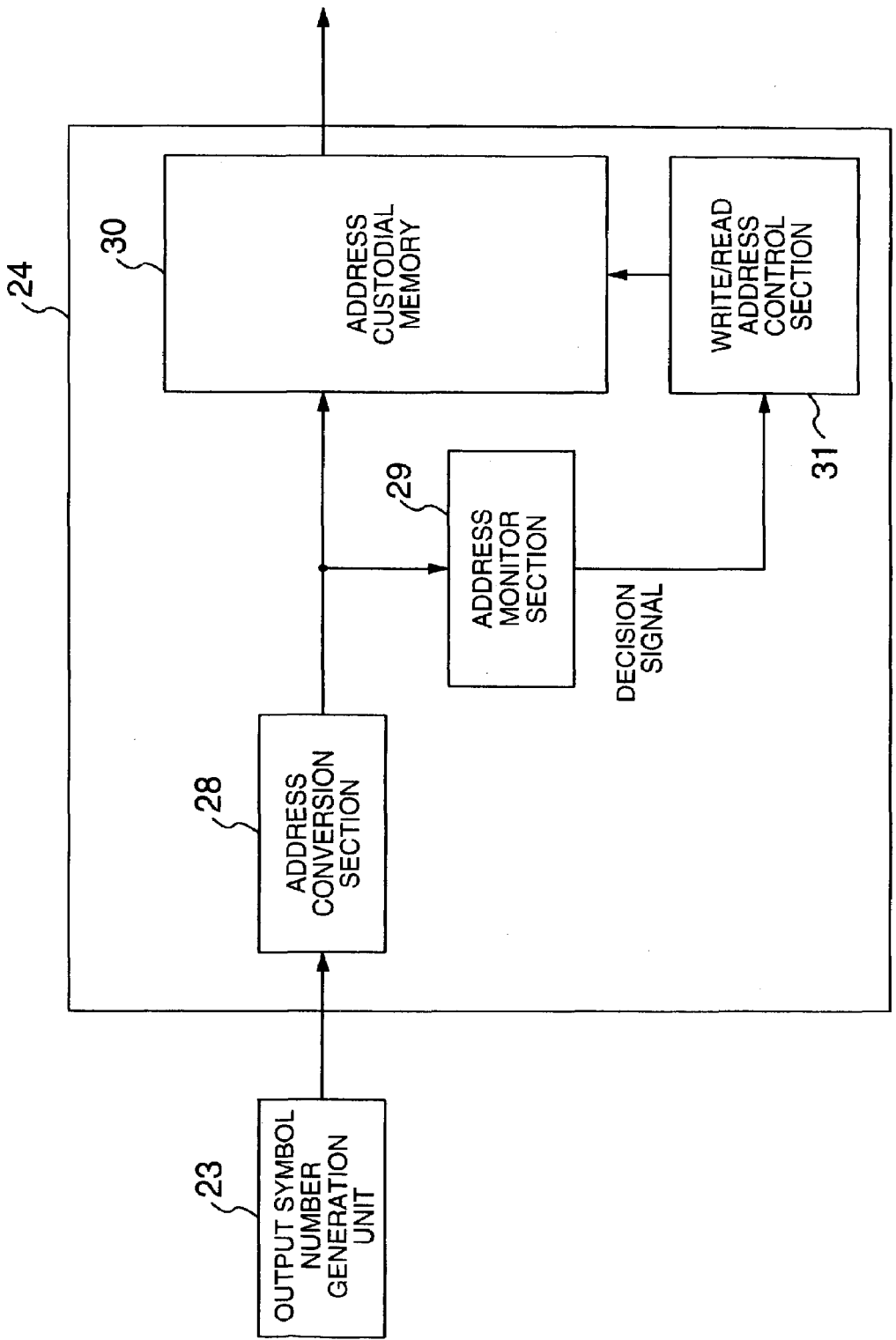
FIG. 4 is a block diagram showing an example of construction of an interleave read address generation unit 24 in the invention.

Turning to FIG. 4, there is illustrated, in block form, an example of construction of the interleave read address generation unit 24 in the present invention. The interleave read address generation unit 24 has an address conversion section 28, an address monitor (decision) section 29, a memory 30 having the custody of addresses, and a write/read address control section 31. The address conversion section 28 responds to an output symbol number generated by the output symbol number generation unit 23 to calculate and generate an interleave address pursuant to the rule in reference 1. The address monitor section 29 decides the interleave address generated by the address conversion section 28 as to whether to correspond to a data storage portion on the interleaver memory 18 and sends to the write/read address control section 31 a decision result in the form of a decision signal. The address custodial memory 30 keeps the interleave address generated by the address conversion section 28 in custody. When an interleave address is written to the address custodial memory 30, the read/write address control section 31 controls determination and generation of a write destination address. Further, when an interleave address is read out of the address custodial memory 30, the write/read address control section 31 controls determination and generation of a read origination address. Specifically, the read/write address control section 31 operates as below. The read/write address control section 31 generates a write destination address and a read origination address for the address custodial memory 30. In case the decision result by the address monitor section 29 indicates that the interleave address corresponds to a data storage portion on the interleaver memory 18, the read destination address is generated repetitively in predetermined order. Contrarily, if the decision result by the address monitor section 29 indicates that the interleave address does not correspond to any data storage portion on the interleaver memory 18, the write/read address control section 31 stops generating a write destination address corresponding to an immediately succeeding interleave address upon delivery of that write destination address and delivers again the same write destination address as that generated immediately precedently. This ensures that the interleave address not corresponding to any data storage portion on the interleaver memory 18 can be overwritten, without fail, with the interleave address generated immediately precedently. Accordingly, the interleave read address read out of the address custodial memory 30 can always correspond to a data storage portion on the interleaver memory 18, thereby preventing any unwanted interleave read address from being delivered. It is to be noted that the read origination address is generated repetitively in predetermined order.

Figure 6:
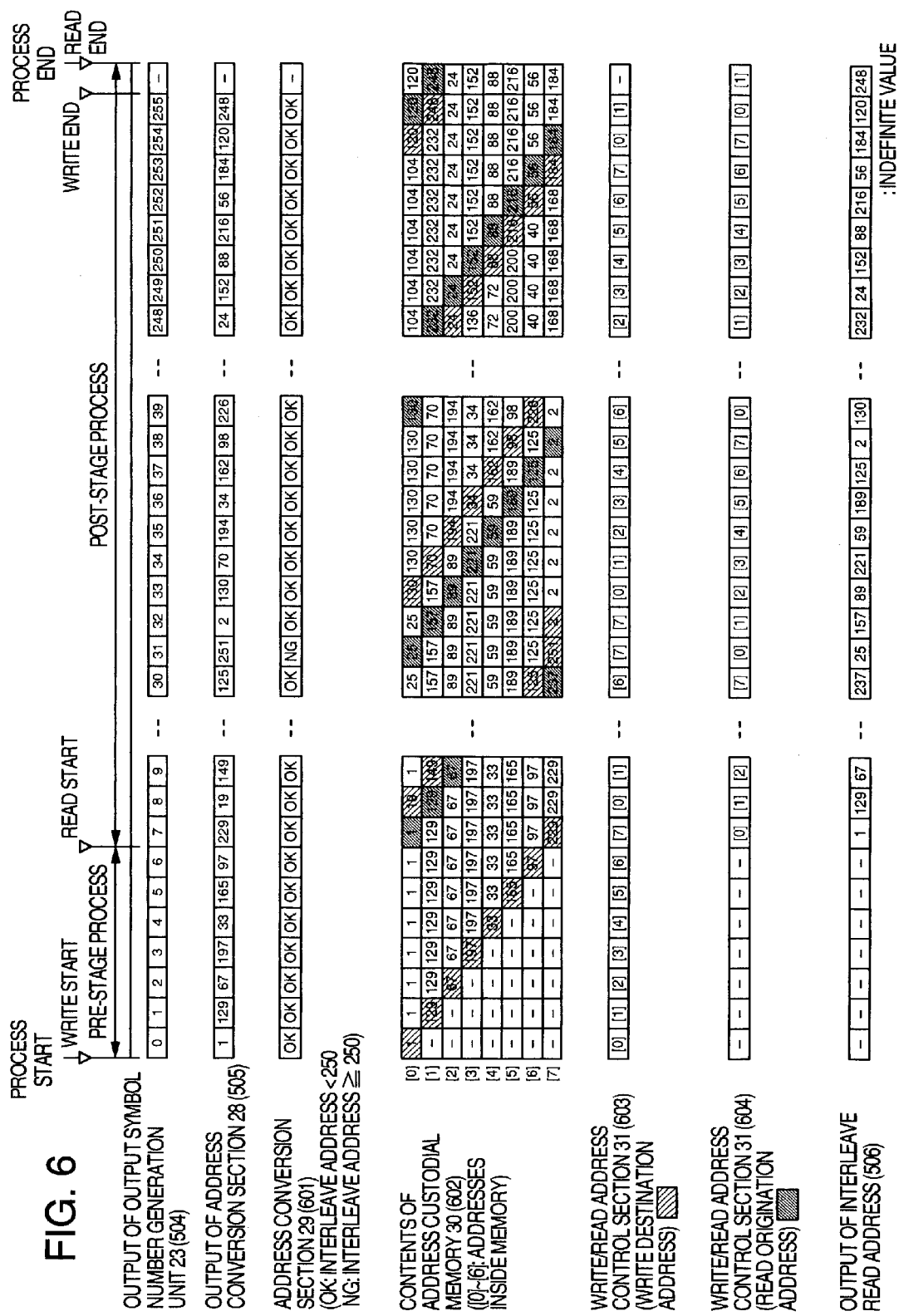
FIG. 6 is a diagram showing a series of processing operations in the interleave read address generation unit 24 in the invention.

Referring now to FIGS. 5 and 6, operation of an interleave address generating process will be described by way of example of an instance where the data length N of data series is 256. In this instance, the data length N' of data series removed of a tail bit portion is 250. Especially, the relation among the interleaver input series, the interleave address and the interleaver output series in the present invention is shown in FIG. 5 and a series of processing operations in the interleave read address generation unit 24 in the present invention is diagrammatically depicted in FIG. 6.

An interleaver input series (501) is a data series written to the interleaver memory 18 and for example, it includes D0, D1, D2, D3, . . . D247, D248 and D249. Responsive to the input symbol clock, the input symbol number generation unit 22 generates an input symbol number corresponding to an interleaver input series (501). The input symbol numbers (502) correspond to D0, D1, D2, . . . D247, D248 and D249, respectively, and for example, they are 0, 1, 2, 3, . . . 247, 248 and 249. The interleaver input series (501) is stored at an interleave write address (503) represented by the input symbol number (502) in the interleaver memory 18. For example, D0, D1, D2, D3, . . . D247, D248 and D249 of the interleaver input series (501) are stored in this order at the interleave write addresses (503) of 0, 1, 2, 3, . . . 247, 248 and 249 in the interleaver memory 18.

On the other hand, the output symbol number generation unit 23 responds to the output symbol clock to start generating an output symbol number (504). For example, the output symbol numbers (504) are 0, 1, 2, . . . 255. In respect of the output symbol numbers (504), the interleave read address generation unit 24 carries out a pre-stage process and a post-stage process. The pre-stage process herein referred to is a process for keeping in custody an interleave address corresponding to a specified output symbol number (504) in the address custodial memory 30 in order to eliminate a delay in processing due to recalculation of the interleave address. In the pre-stage process, a process of writing of the interleave address to the address custodial memory 30 is predominant and the pre-stage process covers a phase ending in start of reading an interleave read address (506) from the address custodial memory 30. On the other hand, the post-stage process is a process for starting reading the oldest one of interleave addresses stored in the address custodial memory 30 and concurrently, writing to the address custodial memory 30 an interleave address corresponding to an output symbol number (504) subsequent to the output symbol number (504) used in the pre-stage process. When receiving the output symbol number (504), the address conversion section 28 calculates and generates an interleave address pursuant to the rule in reference 1. For example, the interleave address (505) generated and outputted by the address conversion unit 28 includes 1, 129, 67, . . . 248.

In the pre-stage process, the address conversion section 28 generates and delivers interleave addresses (505) corresponding to the individual output symbol numbers (504). For example, the address conversion section 28 receives seven output symbol numbers (504) of 0, 1, . . . 6 to generate and deliver seven interleave addresses (505) of 1, 129, . . . 97. Since the seven interleave addresses (505) of 1, 129, . . . 97 are all within the range of from 0 to 249, the address monitor section 29 determines (601) that the individual interleave addresses sequentially delivered out of the address conversion section 28 correspond to data storage portions on the interleaver memory 18. Each time that an interleave address (505) is delivered, the address decision section 29 sends to the write/read address control section 31 a decision result (601) indicating that the interleave address corresponds to a data storage portion on the interleaver memory 18. Outputs (505) from the address conversion section 28 correspond to the data storage portions on the interleaver memory 18 and therefore, indications of the address monitor section 29 are OK in FIG. 6. The write/read address control section 31 generates write destination addresses (603) in predetermined order. For example, the write destination addresses (603) are [0], [1], [2], . . . [7]. The seven interleave addresses (505) of 1, 129, . . . 97 are written to the address custodial memory 30 in accordance with the write destination addresses (603). In the pre-stage process, neither the interleave read addresses (506) nor interleaver output series (507) is delivered out of the address custodial memory 30. Accordingly, in the pre-stage process, the write/read address control unit 31 does not generate any read origination address (604), either.

After the pre-stage process ends, the post-stage process is started. In the post-stage process, the process in the output symbol number generation unit 23, the process in the address conversion section 28, the process in the address monitor section 29, the generation of the write destination address (603) by the write/read address control section 31 and the write of the interleave address (505) to the address custodial memory 30 continue from the pre-stage process. The address conversion section 28 generates interleave addresses (505) corresponding to the individual output symbol numbers (504). For example, the address conversion section 28 receives output symbol numbers (504) of 7, 8, 9 . . . 255 to generate interleave addresses (505) of 229, 19, 149 . . . 248. In case the output symbol number (504) is 31, for instance, an interleave address (505) generated by the address conversion section 28 is 251. In that case, the interleave address (505) does not fall within the range of from 0 to 249 and therefore, the address monitor section 29 determines (601) that the interleave address (505) does not correspond to any data storage portion on the interleaver memory 18. The address monitor section 29 sends to the write/read address control section 31 a decision result (601) indicating that the interleave address does not correspond to any data storage portion on the interleaver memory 18. Because of the fact that outputs (505) from the address conversion section 28 do not correspond to any data storage portion on the interleaver memory 18, indications of the address monitor section 29 are NG in FIG. 6. The write/read address control section 31 generates write destination addresses (603) in predetermined order. For example, the write destination address (603) is now set to [7]. Then, an interleave address (505) of 251 is written to the address custodial memory 30 in accordance with the write destination address (603) of [7]. In this phase, the write/read address control section 31 stops generating a write destination address (603) in respect of an immediately succeeding interleave address (505) and delivers again the same write destination address (603) as that (603) generated immediately precedently. For example, the immediately succeeding interleave address (505) is 2. Then, the write/read address control section 31 stops generating a write destination address (603) in respect of the interleave address (505) of 2 immediately subsequent to 251 and delivers again the write destination address (603) of [7] generated immediately precedently. Through this, in the address custodial memory 30, the interleave address (505) of 2 is overwritten to 251 which has been written at the write destination address (603) of [7]. Accordingly, the interleave read address (506) of 251 is prevented from being read out of the address custodial memory 30.

In the post-stage process, the write/read address control section 31 carries out the aforementioned process of writing the interleave address (505) to the address custodial memory 30 and besides reads the interleave read address (506) for the address custodial memory 30. Interleave read addresses (506) are read out of the address custodial memory 30 sequentially starting with the oldest one of the interleave addresses (505) which have been stored in the address custodial memory 30. The write/read address control section 31 generates read origination addresses (604) in predetermined order starting with an address at which the oldest interleave address (505) has been in custody. Accordingly, for example, the interleave read origination addresses (506) are read in order of 1, 129, 67, . . . 248 in accordance with the respective read origination addresses (604) of [0], [1], [2], . . . [7], [0], [1], . . . .

As described previously, in the address custodial memory 30, the interleave address (505) of 251 has already been overwritten with the interleave address (505) of 2. Accordingly, the unwanted interleave read address (506) of 251 is not read out of the address custodial memory 30 and the interleave address (505) of 2 is read in order advanced by one from that when it has been written.

In the manner described so far, the interleave address (505) of 248 corresponding to the output symbol number (504) of 255, for instance, is finally generated and written to the address custodial memory 30, thus ending a series of write processing operations. Meanwhile, by reading 248, which has been stored in the address custodial memory 30 and has not yet been read, as an interleave read address (506), a series of read processing operations can be ended.

The interleaver output series (507) is data stored in data storage portions corresponding to the respective interleave read addresses (506) and is read out of the interlerver memory 18. For example, D1, D129, D67, . . . D248 of interleaver output series (507) are read in correspondence with respective interleave read addresses (506) of 1, 129, 67, . . . 248.

According to the invention, the interleave address generator 20 can read, without fail, interleave read addresses corresponding to data storage portions on the interleaver memory 18.

It will be appreciated that the address custodial memory 30 undergoes the overwrite process as described previously and hence it needs areas which exceed in number the total of interleave read addresses not corresponding to the data storage portions on the interleaver memory 18. Specifically, when the read process and the write process are carried out separately, the address custodial memory 30 needs to be so sized as to have areas exceeding in number the total of overwrite processed addresses equal to six. Further, when the read process proceeds even during the overwrite process, areas are needed which exceed, in number, seven equal to addition of 1 to the total of interleave read addresses not corresponding to the data storage portions on the interleaver memory 18. Furthermore, when the write process and the read process are carried out substantially concurrently, areas are needed which exceed, in number, eight equal to further addition of 1 to the total of interleave read addresses not corresponding to any data storage portion on the interleaver memory 18. Specifically, in the processing operation example shown in FIG. 6 in which read operation is carried out during the overwrite process and the write and read processes proceed substantially simultaneously, the address custodial memory 30 is so sized as to have eight areas. During execution of the aforementioned pre-stage process, areas similarly comply with the total of interleave read addresses not corresponding to the data storage portions on the interleaver memory 18.

In case the data length N' of data series removed of the tail bit portion is represented by 506, 1018, 2042 and 4090, a similar interleave operation can also be realized through a process similar to that for N' being 250.

The de-interleave address generator 21 can be constructed similarly to the interleave address generator 20. Specifically, in the de-interleave address generator 21, it is preferable that the write process and the read process in the interleave address generator 20 be inverted to each other to permit the de-interleave write address generation unit 26 to have construction and processing operation similar to those of the interleave read address generation unit 24.

Accordingly, in contrast to the related arts, the present invention can dispense with a memory for storing all of the interleave read addresses and de-interleave write addresses and in addition, need not make correction or recalculation attributable to calculation of interleave addresses not corresponding to any data storage portion on the interleaver memory 18. Further, according to the invention, the interleave read address generation unit 24 or de-interleave write address generation unit 26 can be implemented in a small circuit scale with simplified logical circuits.

Another embodiment of the invention will now be described. The present embodiment differs from the foregoing embodiment in that the delay time between inputting of the output symbol numbers and outputting of all data on the interleaver memory 18 is decreased. The foregoing embodiment need not have a plurality of address conversion sections and has a smaller circuit scale than that of the present embodiment.

Figure 7:
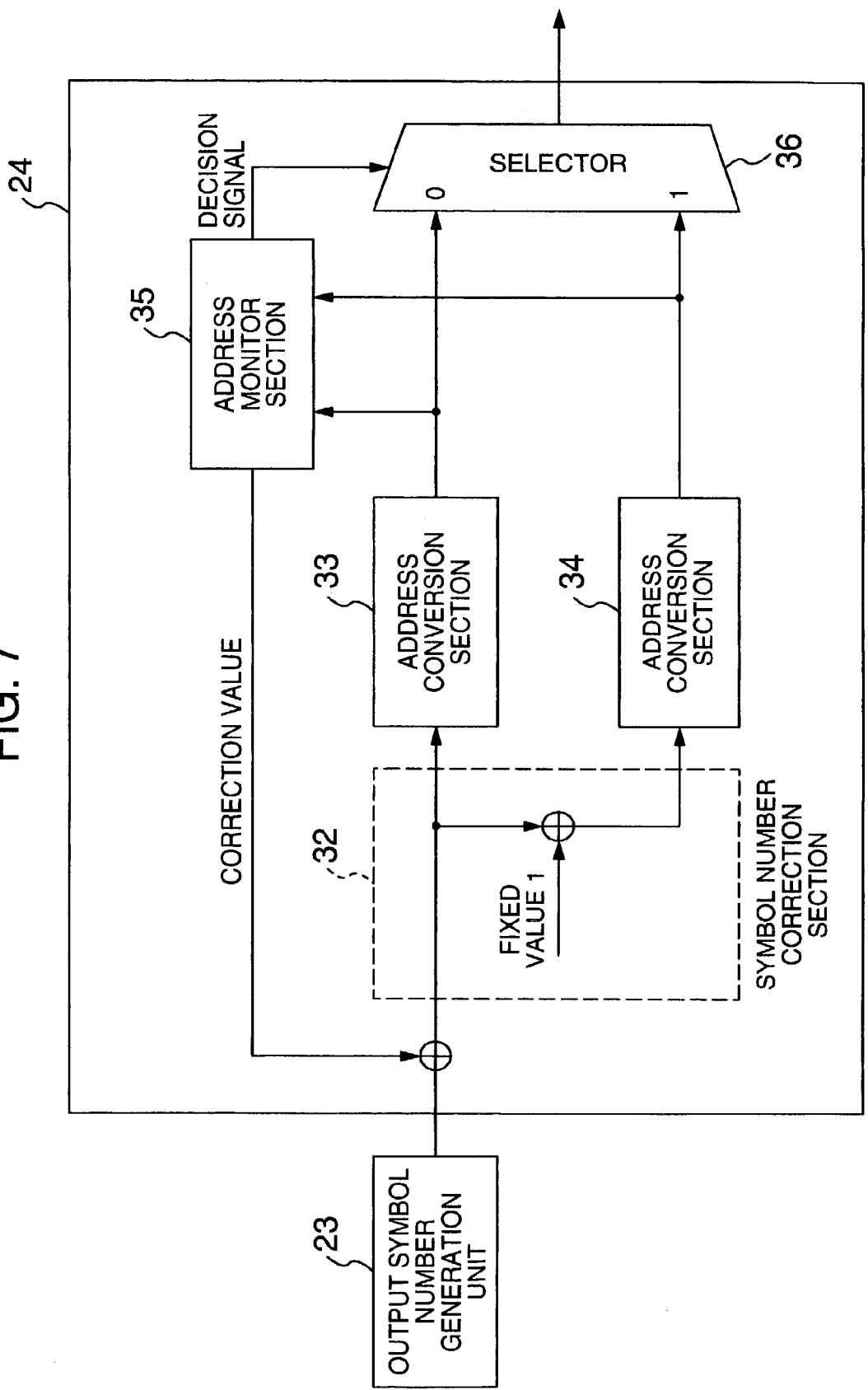
FIG. 7 is a block diagram showing another example of construction of the interleave read address generation unit 24 in the invention.

Referring to FIG. 7, there is illustrated, in block form, an example of construction of an interleave read address generation unit 24 in the present invention. The interleave read address generation unit 24 has a symbol number correction section 32, an address conversion section 33, an address conversion section 34, an address monitor (decision) section 35 and a selector 36. The symbol number correction section 32 sends to the address conversion section 33 a number resulting from addition of a correction value to an output symbol number. The symbol number correction section 32 adds a fixed value 1 to the number equal to the output symbol number added with the correction value and also sends a resulting corrected number to the address conversion section 34. The address conversion sections 33 and 34 are connected in parallel to the correction section. Like the previously-described address conversion section 28, each of the address conversion sections 33 and 34 calculates and generates an interleave address pursuant to the rule in reference 1 in respect of an inputted number. Like the previously-described address decision section 29, the address monitor section 35 decides whether the interleave address generated by the address conversion section corresponds to a data storage portion on the interleaver memory 18. The address monitor section 35 partly differs from the previously-described address monitor section 29 in that it decides interleave addresses generated by the plural address conversion sections represented by the address conversion sections 33 and 34 and sends decision results in the form of decision signals to the selector 36. The address monitor section 35 cumulates frequencies of occurrence of such an event that the output from the address conversion section 33 does not correspond to any data storage portion on the interleaver memory 18 and saves a cumulative frequency as a correction value. Each time that an output symbol number is generated from the output symbol number generation unit 23, the address monitor section 35 adds the correction value to the output symbol number. The selector 36 switches the outputs of the address conversion sections 33 and 34 in accordance with the decision result of the address monitor section 35. Specifically, the address monitor section 35 or the selector 36 operates as follows. The selector 36 receives interleave addresses delivered out of the address conversion sections 33 and 34 and preferentially delivers the output from the address conversion section 33 as an interleave read address. But in case the output from the address conversion section 33 is an interleave address not corresponding to any data storage portion on the interleaver memory 18 and the address monitor section 35 informs the selector 36 of this fact, the selector 36 delivers the output from the address conversion section 34 as an interleave read address in place of the output from the address conversion section 33. In subsequent interleave read address delivery, too, the selector 36 preferentially delivers the output from the address conversion section 34 as an interleave read address. The address conversion section has the priority. The smaller the fixed value added to an address conversion section, the higher the priority of that address conversion section becomes. For this reason, the address conversion section 33 has higher priority than the address conversion section 34 and therefore, when interleave addresses delivered out of the address conversion sections 33 and 34 are both those corresponding to data storage portions on the interleaver memory 18, the interleave address delivered out of the address conversion section 33 is preferentially outputted.

Figure 9:
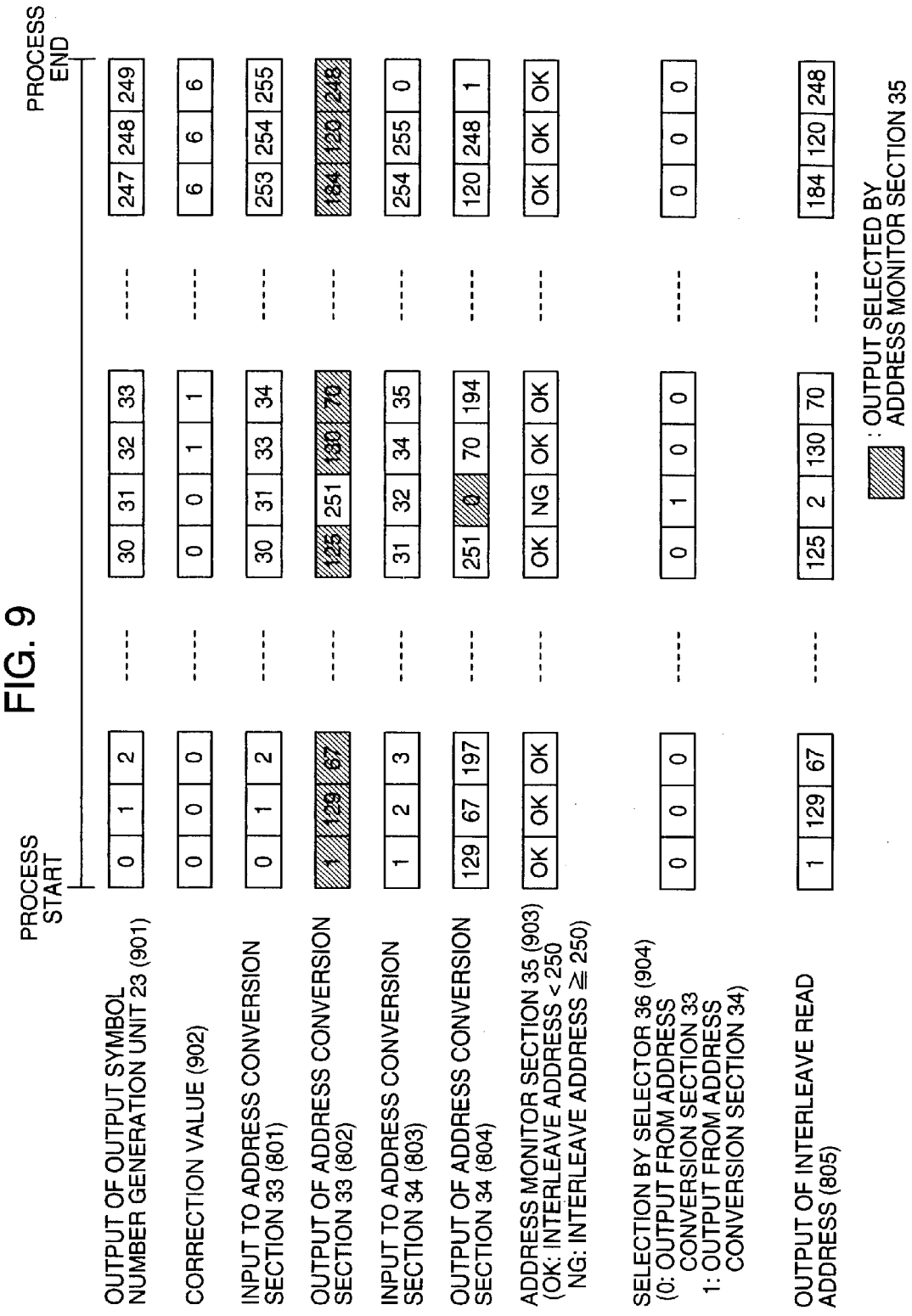
FIG. 9 is a diagram showing a series of processing operations in the interleave read address generation unit 24 in the invention.

Referring now to FIGS. 8 and 9, processing and operation for interleave address generation will be described by taking the data length N of data series being 256, for instance. Data length N' of data series removed of the tail bit portion is 250 as described above. FIG. 8 shows the relation among the interleaver input series, the interleave address and the interleaver output series in the present invention. FIG. 9 diagrammatically shows a series of processing operations in the interleave read address generation unit 24 in the invention.

In FIG. 8, interleaver input series (501), input symbol number (502) and interleave write address (503) are similar to those in FIG. 5. Output symbol number (901) is generated by a method similar to that applied to the previously-described output symbol number (504) and takes values of 0, 1, 2, ... 249, for instance. The symbol number correction section 32 sends to the address conversion section 33 a number resulting from addition of a correction value to an output symbol number (504) and adds a fixed value 1 to the number obtained through the addition of a correction value to an output symbol number (504), thus sending a resulting correction number to the address conversion section 34. For example, when the input (801) to the address conversion section 33 includes 0, 1, 2, ..., the input (803) to the address conversion section 34 includes 1, 2, 3, .... The address conversion section 33 generates and delivers interleave addresses (802) corresponding to the respective inputs (801) to the address conversion section 33. For example, the address conversion section 33 receives inputs (801) of 0, 1, 2, ... to generate and deliver interleave addresses (802) of 1, 129, 67, .... The address conversion section 34 generates and delivers interleave addresses (804) corresponding to the respective inputs (803) to the address conversion section 34. For example, the address conversion section 34 receives inputs (803) of 1, 2, 3, . . . to generate and deliver interleave addresses (804) of 129, 67, 197, . . . .

The address monitor section 35 decides whether the interleave addresses generated by the address conversion sections 33 and 34 correspond to data storage portions on the interleaver memory 18. For example, outputs (802) of 1, 129 and 67 from the address conversion section 33 and outputs (804) of 129, 67 and 197 from the address conversion section 34 all fall within the range of from 0 to 249 and therefore, the address decision section 35 determines (903) that the interleave addresses correspond to data storage portions on the interleaver memory 18. Each time that each of the address conversion sections 33 and 34 delivers an output, the address monitor section 35 decides the correspondence with a data storage portion on the interleaver memory 18 and sends a decision result (903) to the selector 36. In FIG. 9, the output (802) from the address conversion section 33 corresponds to the data storage area on the interleaver memory 18 and hence the address decision section 35 indicates OK. Responsive to the decision result (903) indicative of the correspondence with the data storage portion on the interleaver memory 18, the selector 36 preferentially selects the output (802) delivered out of the address conversion section 33. In FIG. 9, since the output (802) from the address conversion section 33 is selected, the selector 36 indicates 0. In this case, the selector 36 delivers the output (802) from the address conversion section 33 as interleave read address (805). For example, when the output (802) from the address conversion section 33 includes 1, 129 and 67, the interleave read address (805) includes 1, 129 and 67, respectively.

For example, when the output symbol number (901) is 31, the output (802) from the address conversion section 33 is set to 251 and the output (804) from the address conversion section 34 is set to 2. At that time, the output (802) of 251 from the address conversion section 33 does not fall within the range of from 0 to 249 and consequently, the address monitor section 35 determines (903) that the output (802) of the address conversion section 33 does not correspond to any data storage portion on the interleaver memory 18. The address monitor section 35 sends to the selector 36 a decision result (903) indicative of the fact that the output (802) from the address conversion section 33 does not correspond to any data storage portion on the interlerver memory 18. Since the output (802) from the address conversion section 33 does not correspond to any data storage portion on the interleaver memory 18, the address decision section 35 indicates NG as shown in FIG. 9. The selector 36 responds to the decision result (903) of the address decision section 35 to deliver the output (804) from the address conversion section 34 as an interleave read address (805) in place of the output (802) from the address conversion section 33. In FIG. 9, because of the selection of the output (804) from the address conversion section 34, the selector 36 indicates 1. Then, the interleave read address (805) takes, for example, 2 representing the output (804) from the address conversion section 34.

In this example, the interleave read address (805) delivered (804) out of the address conversion section 34 is the output (802) from address conversion section 33 corresponding to an immediately succeeding output symbol number (901). For example, when the output symbol number (901) is 31, the interleave address (804) delivered out of the address conversion section 34 is 2. This is the same as 2 of interleave address (802) which is delivered out of the address conversion section 33 in correspondence with an output symbol number (901) of 32 immediately subsequent to 31. Accordingly, in case the output (802) from the address conversion section 33 does not correspond to any data storage portion on the interleaver memory 18, the address monitor section 35 must add to the immediately subsequent output symbol number (901) a correction value (901) of 1. Preferably, for example, the correction value (902) of 1 is added to the output symbol number (901) immediately subsequent to 31 and a corrected number of 33 is inputted to the symbol number correction section 32.

As will be seen from the above, the correction value (902) is preferably given an initial value of 0 and is always added to the output symbol number (901). Each time that such an event that the output (802) from the address conversion section 33 does not correspond to any data storage portion on the interleaver memory 18 arises, the correction value (902) is added with 1. In other words, the correction value is a cumulative value of occurrence frequencies of such events that the outputs (802) from the address conversion section 33 do not correspond to any data storage portion on the interleaver memory 18. The output symbol number (901) is always corrected by the correction value (902), thereby preventing the interleave read address generation unit 24 from generating the same interleave read address (805) plural times. Each time that such an event that the output (802) from the address conversion section 33 does not correspond to any data storage portion on the interleaver memory 18 arises, the address monitor section 35 adds 1 to the correction value (902).

Consequently, in correspondence with the respective interleave read addresses (805) of, for example, 1, 129, 67, . . . 248, an interleaver output series (806) of D1, D129, D67, . . . D248 is read.

According to the present embodiment, too, the interleave address generator 20 can deliver interleave read addresses corresponding to data storage portions on the interleaver memory 18 without fail.

Figure 10:
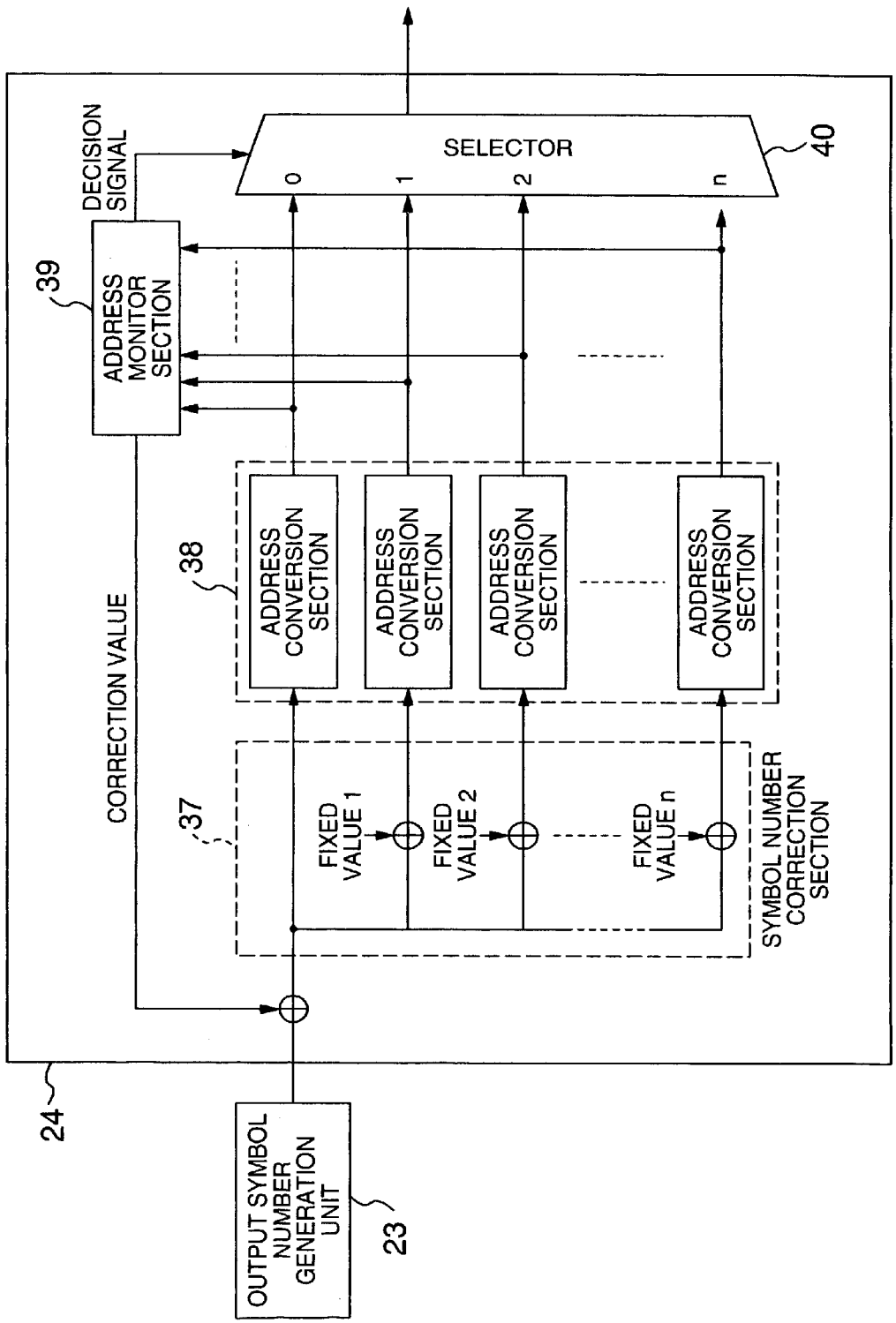
FIG. 10 is a block diagram showing still another example of the interleave read address generation unit 24 in the invention.

In the present embodiment, the two address conversion sections 33 and 34 are employed but this is not limitative and a larger number of address conversion sections may preferably be arranged in parallel. In this case, the number of address conversion sections depends on the maximum number of continuously generative interleave read addresses not corresponding to any data storage portion on the interleaver memory 18. FIG. 10 is a block diagram showing an example of construction of the interleave read address generation unit 24 in the present invention, depicting an embodiment in which the number of address conversion sections is more increased than in FIG. 7. In FIG. 10, (n+1) address conversion sections are provided to make it possible to deal with an instance where interleave addresses not corresponding to any data storage portion on the interleaver memory 18 are possibly generated n times. Symbol number correction section 37, address conversion section 38, address monitor (decision) section 39 and selector 40 perform processes similar to those carried out by the symbol number correction section 32, address conversion section 33, address monitor section 35 and selector 36, respectively. When the address conversion section 38 has 0-th stage, 1-st stage, 2-nd stage, . . . n-th stage, upper to lower in the drawing, a number inputted to the n-th stage of the address conversion section 38 is a correction number in which a fixed value n is added to a number resulting from addition of a correction value to an output symbol number. Each of the stages of address conversion section has such priority that the smaller the fixed value added to a stage, the higher the priority of that stage becomes. In this case, the correction value is a cumulative value of n representing the number of stages of address conversion section 38 which deliver interleave addresses selected as interleave read addresses by the selector 40.

Still another embodiment of the invention will be described. In the present embodiment, in addition to the address conversion section and address decision section, a read address control section is provided to minimize the circuit scale as compared to the foregoing embodiments. In the foregoing embodiments, reading of a data series from the interleaver memory is not suspended, having no influence on the peripheral circuits as compared to the present embodiment.

Figure 11:
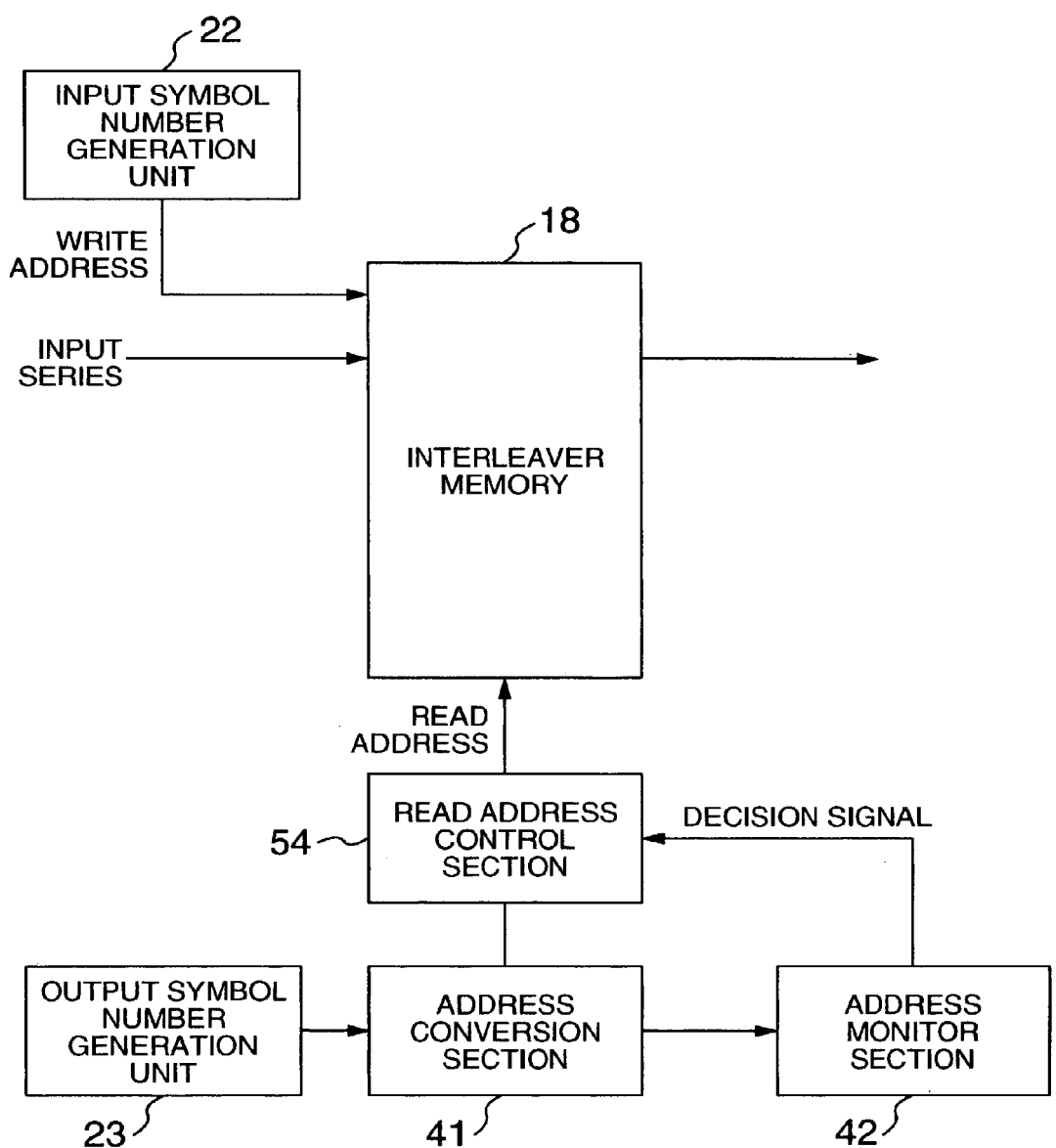
FIG. 11 is a block diagram showing an example of construction of a system for generating interleave read addresses in the invention.

Referring to FIG. 11, there is illustrated, in block form, an example of construction of a system for generating interleave read addresses in the present invention. The system shown in FIG. 11 has an interleaver memory 18, an input symbol number generation unit 22, an output symbol number generation unit 23, an address conversion section 41, an address monitor (decision) section 42 and a read address control section 54. The interleaver memory 18, input symbol number generation unit 22 and output symbol number generation unit 23 are similar to those described in connection with the foregoing embodiments. Like the previously-described address conversion section 28, the address conversion section 41 calculates and generates an interleave address pursuant to the rule in reference 1 in respect of an output symbol number. Like the previously-described address monitor section 29, the address monitor section 42 decides the interleave address generated by the address conversion section as to whether to correspond to a data storage portion on the interleaver memory 18. The address monitor section 42 partly differs from the aforementioned address monitor section 29 in that it sends a decision result in the form of a decision signal to the read address control section 54. When reading an interleave read address from the interleaver memory 18, the read address control section 54 controls determination and generation of a read origination address. Responsive to a decision result of the address monitor section 42, the read address control section 54 stops generating the interleave read address and delivers again the same interleave read address as that delivered immediately precedently.

Figure 13:
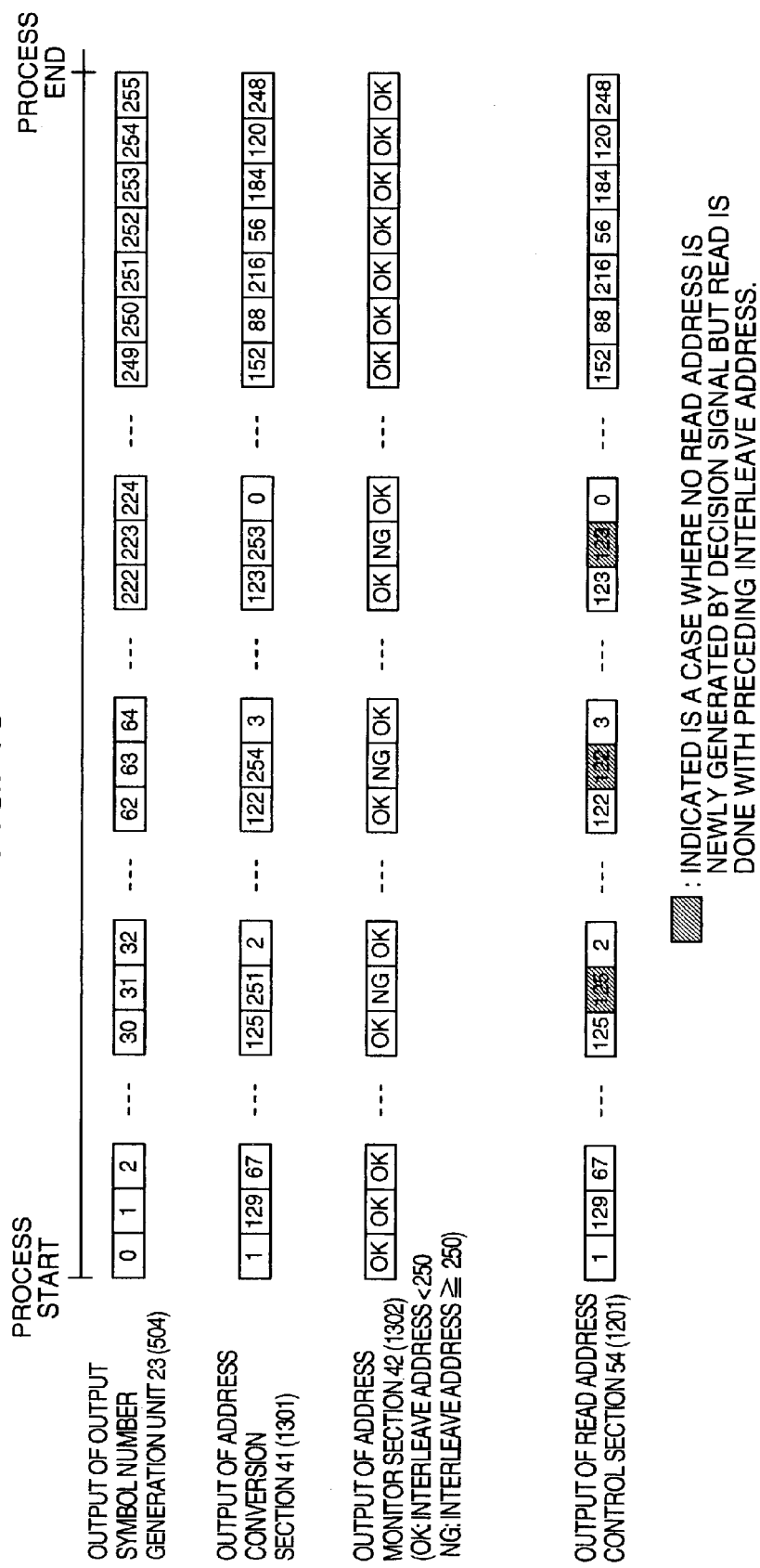
FIG. 13 is a diagram showing a series of processing operations in the interleave address generation in the invention.

Referring now to FIGS. 12 and 13, operation of a process for generation of interleave addresses will be described by way of example of the data length N of data series being 256. The data length N' of data series removed of the tail bit portion is 250 as described previously. FIG. 12 shows the relation among interlerver input series, interleave address and interleaver output series in the present invention. FIG. 13 diagrammatically shows a series of process operations in the interleave address generation in the present invention.

In FIG. 12, interleaver input series (501), input symbol number (502), interleave write address (503) and output symbol number (504) are similar to those in FIG. 5. The output symbol number (504) is generated through the previously-described method and includes, for example, 0, 1, 2, . . . 255. Like the foregoing address conversion section 28, the address conversion section 41 generates and delivers interleave addresses (1301) corresponding to respective ones of inputted output symbol numbers (504). For example, the address conversion section 41 receives inputs (504) of 0, 1, 2, . . . 255 to generate and deliver interleave addresses (1301) of 1, 129, 67, . . . 248. Like the foregoing address monitor section 29, the address monitor section 42 decides whether the interleave addresses (1301) generated by the address conversion section 41 correspond to data storage portions on the interleaver memory 18. As in the case of the foregoing embodiments, the address monitor section 42 determines (1302) that the respective outputs (1301) of, for example, 1, 129 and 67 from the address conversion section 41 correspond to data storage portions on the interleaver memory 18. In this case, the address monitor section 42 indicates OK in FIG. 13. Also, similar to the foregoing embodiments, the address monitor section 42 determines (1302) that the respective outputs (1301) of, for example, 251, 254 and 253 from the address conversion section 41 do not correspond to any data storage portion on the interleaver memory 18. In this case, the address monitor section 42 indicates NG in FIG. 13. The address monitor section 42 sends the monitoring or decision result (1302) to the read address control section 54.

When the decision results (1302) indicate the correspondence with data storage portions on the interleaver memory 18, the read address control section 54 generates outputs (1301) from the address conversion section 41 as interleave read addresses (1201) and delivers them. For example, the read address control section 54 receives inputs (1301) of 1, 129 and 67 to generate and deliver interleave read addresses (1201) of 1, 129 and 67, respectively. When the decision result (1302) indicates non-correspondence with any data storage portion on the interleaver memory 18, the read address control section 54 does not generate the output (1301) from the address conversion section 41 as the interleave read address (1201) but instead, delivers again the same interleave read address (1201) as the interleave read address (1201) delivered immediately precedently. For example, when receiving an input (1301) of 251, the read address control section 54 does not generate 251 as interleave read address (1201) but generates and delivers an interleave read address (1201) of 125 which has been delivered immediately precedently. Similarly, in case the read address control section 54 receives inputs (1301) of, for example, 254 and 253, it delivers again the same interleave read addresses (1201) as those delivered immediately precedently, that is, 122 and 123, respectively. The invention is not limited to the case as above but when the decision result (1302) indicates non-correspondence with any data storage portion on the interleaver memory 18, the read address control section 54 may not generate the output (1301) from the address conversion section 41 as interleave read address (1201) and may not deliver any interleave read address (1201), either.

Figure 14:
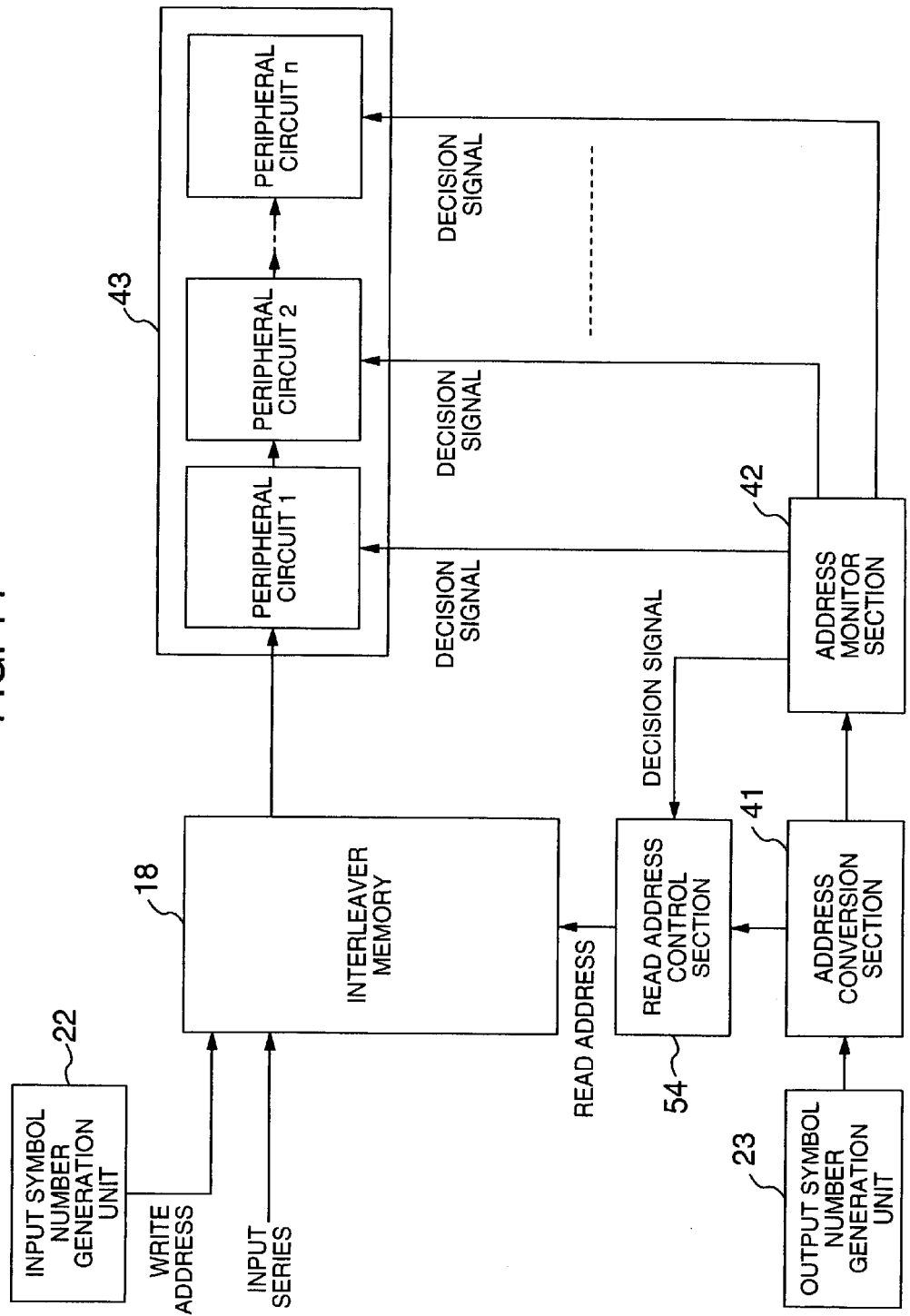
FIG. 14 is a block diagram showing an example of the construction for temporarily stopping a processing operation of a peripheral circuit of interleaver memory 18.

Either when the same interleave read address (1201) as that delivered immediately precedently is again outputted or when no interleave read address (1201) is outputted, no data is read out of the interleaver memory 18. Accordingly, in this case, it is preferable to temporarily stop the processing operation in the peripheral circuit of the interleaver memory 18, too. An example of temporary stoppage of processing operation in the peripheral circuit is shown in FIG. 14. In FIG. 14, interleaver memory 18, input symbol number generation unit 22, output symbol number generation unit 23, address conversion section 41 and read address control section 54 perform processing operations similar to those in FIG. 11. In addition to a processing operation similar to that in FIG. 11, an address monitor (decision) section 42 sends a monitoring or decision result (1302) in the form of a decision signal to also a peripheral circuit 43. When the decision result (1302) indicates non-correspondence with any data storage portion on the interleaver memory 18, the address monitor section 42 sends the monitoring or decision result to the read address control section 54 and peripheral circuit 43, thus stopping the read process from the interleaver memory 18 and the process of the peripheral circuit 43. In this case, peripheral circuits 1, 2, 3, ... n included in the peripheral circuit 43 may preferably be stopped in delay time relation. By stopping each of the peripheral circuits 1, 2, 3, ... n in sequence during a time period corresponding to an interleave read address (1201) at which the read process from the interleaver memory 18 is stopped, the influence upon the peripheral circuit 43 can be prevented. In order to stop the peripheral circuits 1, 2, 3, ... n in sequence, the address monitor section 42 preferably shifts timing for sending the decision result (1302) to the individual peripheral circuits 1, 2, 3, ... n. In an alternative method, the address monitor section 42 calculates timings for stopping the process of the peripheral circuit (1302) and informs the respective peripheral circuits 1, 2, 3, ... n of calculation results. Then, each of the peripheral circuits 1, 2, ... n preferably stops the process in accordance with the notified calculation result. The peripheral circuit 43 referred to herein is an electronic appliance for applying some processing to the data series read out of the interleaver memory 18.

Figure 15:
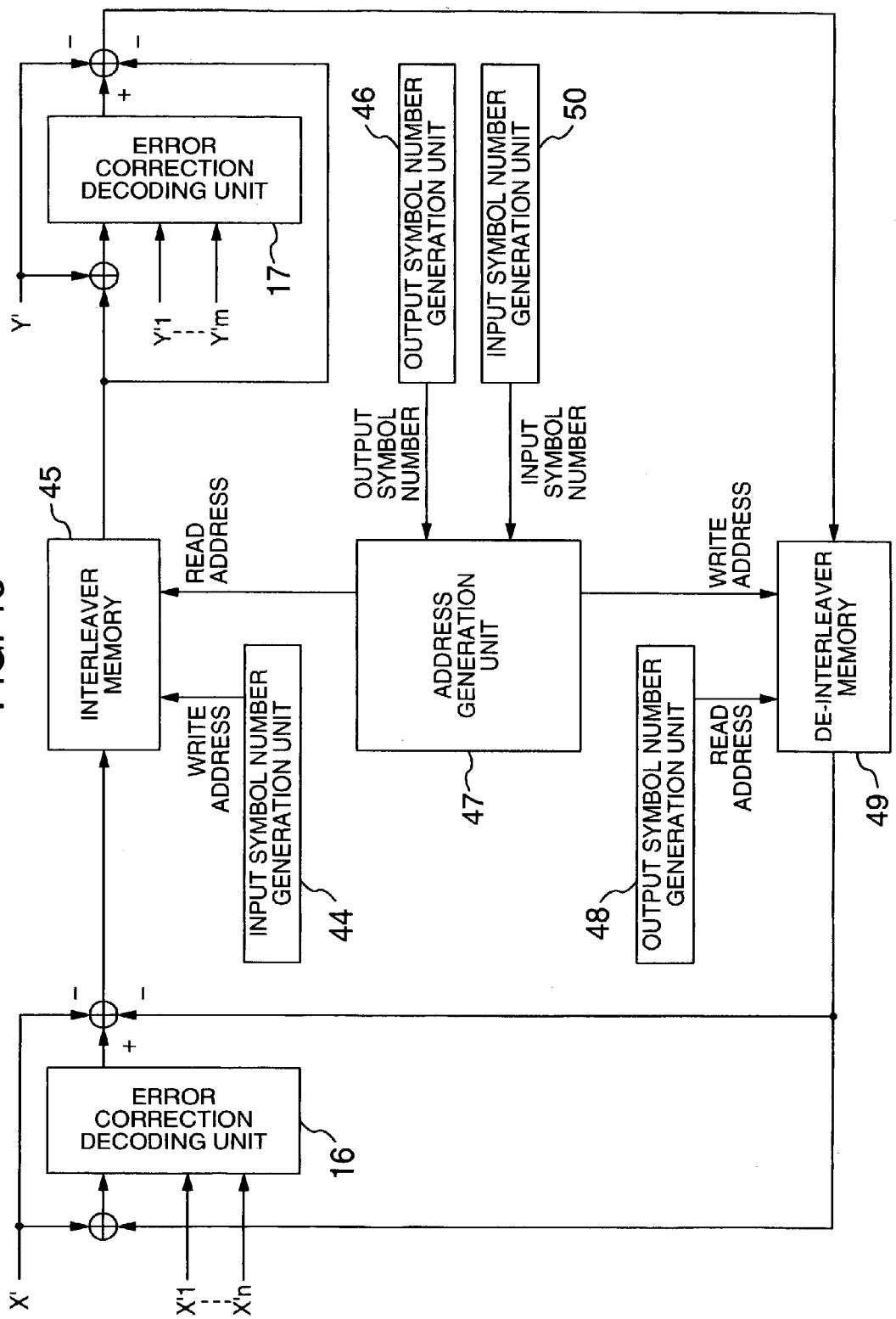
FIG. 15 is a block diagram showing another example of construction of the turbo decoder in the invention.

Consequently, in correspondence with interleave read addresses (1201) of, for example, 1, 129, 67, ... 248, an interlerver output series (1202) of D1, D129, D67, ... D248 are read out. The interleave read address generation unit 24 and de-interleave write address generation unit 26 have the same circuit construction in one turbo decoder and therefore they can be used in common. FIG. 15 shows, in block form, another example of construction of the turbo decoder in the present invention and in this example, the interleave read address generation unit 24 and de-interleave write address generation unit 26 in FIG. 2 are structurally used in common. An input symbol number generation unit 44 generates interleave write addresses for an interleaver memory 45. An output symbol number generation unit 46 delivers an output symbol number and an address generation unit 47 generates an interleave read address for the interleaver memory 45 on the basis of the output symbol number. Meanwhile, an input symbol number generation unit 50 delivers an input symbol number and the address generation unit 47 generates a de-interleave write address for a de-interleaver memory 49 on the basis of the input symbol number. An output symbol number generation unit 48 generates a de-interleave read address for the de-interleaver memory 49.

Structurally, the present invention is not limited only to the foregoing embodiments but can be changed additionally in various ways. For example, when constraint length K=5 and coding ratio R=⅓ are used in the internal construction of the convolutional encoder, the tail bit is of 8 bits. In this case, the data length N of data series is set in the address decision section and the address decision section decides an address at which data does not exist on the memory to prevent the process from proceeding when the address at which no data exists on the memory comes. This enables the process to proceed within only the range in which data exists while maintaining random properties.

Figure 16:
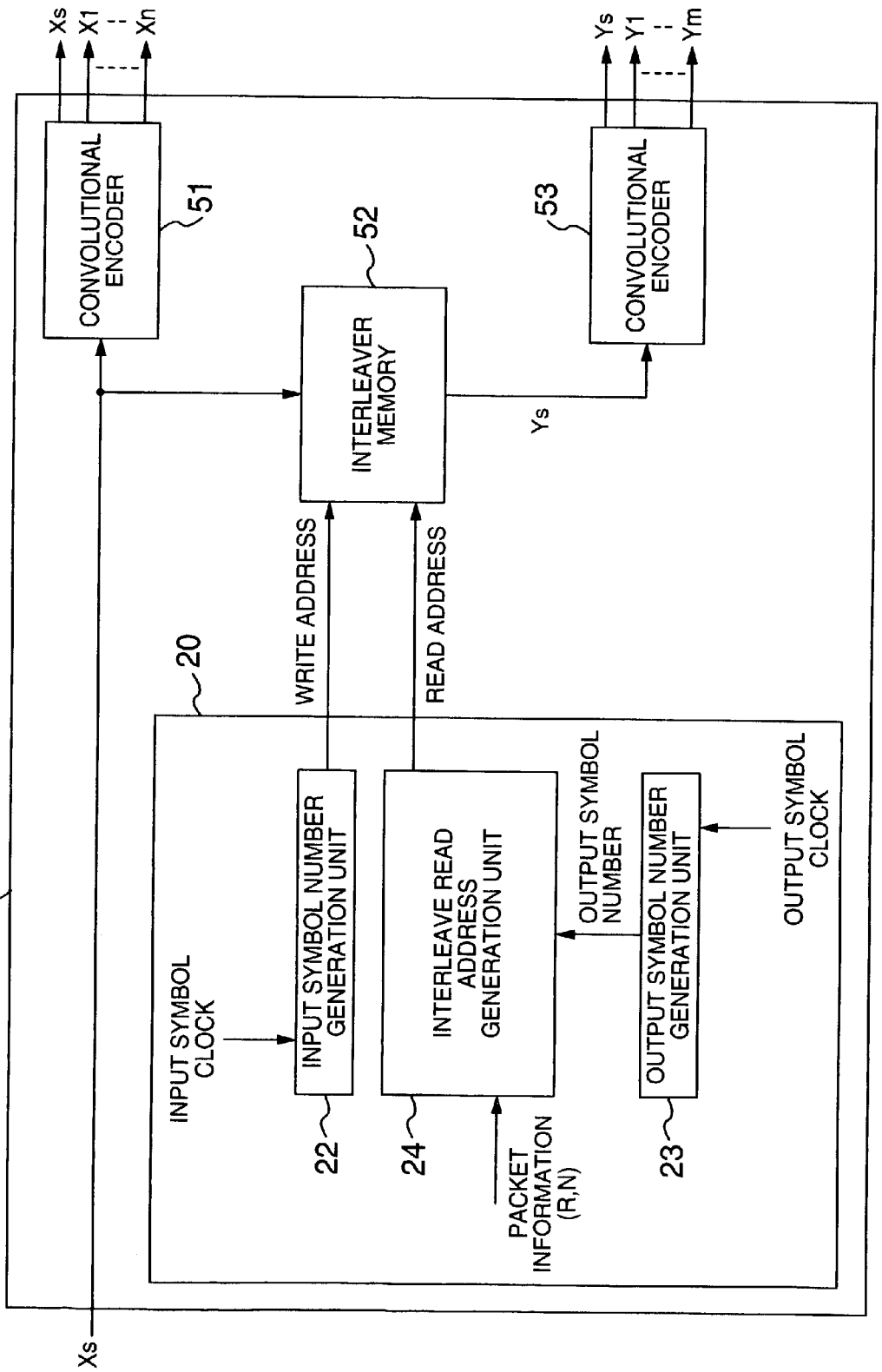
FIG. 16 is a block diagram showing an example of construction of the turbo encoder 14 in the invention.

In communication systems, the contents of processes by the turbo coder and turbo decoder is determined by predetermined parameters such as constraint length K and coding ratio R of the convolutional encoder. In addition, the processes executed by the interleaver of turbo decoder and by the interleaver of turbo encoder have the same contents. In other words, by using the aforementioned interleaver of turbo decoder of the invention, the interleaver of turbo encoder can be realized. FIG. 16 shows, in block form, an example of construction of the turbo encoder 14 in the present invention. The turbo encoder 14 includes a convolutional encoder 51 for performing convolutional coding of a data series Xs, a convolutional encoder 53 for performing convolutional coding of an interleaved data series Ys and an interleaver memory 52. It further includes an interleave address generator 20 for managing write/read addresses for the interleaver memory 52. An input symbol number generation unit 22 for generating write addresses for the interleaver memory 52 receives an input symbol clock supplied externally to generate sequential numbers in accordance with the clock and generates interleave write addresses for writing an input series to the interleaver memory 52. An output symbol number generation unit 23 for delivering symbol numbers generated by a built-in counter receives an externally supplied output symbol clock similar to the input symbol clock supplied to the input symbol number generation unit 22 and counts the clock by means of a counter to generate sequential numbers (output symbol numbers) in accordance with count values. The interleave address generation unit 20 in the exemplified construction of FIGS. 4, 7 or 10 of the invention responds to an output symbol number to generate a random interleave address calculated pursuant to the rule in reference 1 and corresponding to a data storage portion on the interlearver memory 18. In the example of construction of FIG. 11 or 14, the process proceeds only when a random address calculated pursuant to the rule in reference 1 and falling within the range in which data exist on the memory is generated. With the construction as above, by using the interleaver of turbo decoder of the invention, the interleaver of turbo encoder can be realized.

As described above, according to the invention, the interleave read address generation unit or de-interleave write address generation unit can be implemented in a small circuit scale. Further, by sharing the interleave read address generation unit and the de-interleave write address generation unit, the circuit scale can further be decreased and power consumption can be reduced. Moreover, when radio communication using the turbo coding as shown in FIG. 1 is carried out, recalculation of address generation is unneeded to permit high-speed communication.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A turbo decoder comprising:
an error correction decoding unit for performing error correction decoding of an inputted data series;
a first memory to which the data series subjected to error correction coding by said error correction decoding unit is written; and
an address generator for supplying, when writing said data series undergoing error correction decoding is written to said first memory, write addresses and when said data series written to said first memory is read out of said first memory, supplying random read addresses, wherein said address generator converts values pursuant to a predetermined rule into said random read addresses and decides whether said random read addresses correspond to data storage portions on said first memory, and
wherein said address generator randomly reads the data series written to said first memory by using said random mad addresses when a result of said decision indicates that said random read addresses correspond to data storage portions on said first memory, and it randomly reads the data series written to said first memory by using different random read addresses substituting for said random read addresses when said random read addresses do not correspond to any data storage portion on said first memory.

2. A turbo decoder according to claim 1, wherein deciding a random read address as to whether to correspond to a data storage portion on said first memory is made by deciding whether said random read address exceeds a bit number resulting from subtraction of tail bits from an information bit number of said data series subject to error correction decoding.

3. A turbo decoder comprising:
an error correction decoding unit for performing error correction decoding of an inputted data series;
a first memory to which the data series subjected to error correction coding by said error correction decoding unit is written; and an address generator for supplying, when writing said data series undergoing error correction decoding is written to said first memory, write addresses and when said data series written to said first memory is read out of said first memory, supplying random read addresses,
wherein said address generator converts values pursuant to a predetermined rule into said random read addresses and decides whether said random read addresses correspond to data storage portions on said first memory,
wherein said address generator includes:
an address conversion section for converting values pursuant to said predetermined rule into said random read addresses,
a second memory for storing said random read addresses converted by said address conversion section, and
an address control section for controlling write of said converted random read addresses to said second memory or read of said random read addresses from said second memory,
whereby when said decision result indicates that a random read address does not correspond to any data storage portion on said first memory, said address control section overwrites said random read address which has already been written to said second memory with a random read address converted immediately subsequently to said random read address.

4. A turbo decoder according to claim 3, wherein deciding a random read address as to whether to correspond to a data storage portion on said first memory is made by deciding whether said random read address exceeds a bit number resulting from subtraction of tail bits from an information bit number of said data series subject to error correction decoding.

5. A turbo decoder comprising:
an error correction decoding unit for performing error correction decoding of an inputted data series;
a first memory to which the data series subjected to error correction coding by said error correction decoding unit is written; and
an address generator for supplying, when writing said data series undergoing error correction decoding is written to said first memory, write addresses and when said data series written to said first memory is read out of said first memory, supplying random read addresses,
wherein said address generator converts values pursuant to a predetermined rule into said random read addresses and decides whether said random read addresses correspond to data storage portions on said first memory, and
wherein said address control section stops reading a random read address from said second memory during a predetermined period following start of write to said second memory and starts reading a random read address from said second memory after said predetermined period has elapsed, said predetermined period complying with the total of random read addresses not corresponding to any data storage portion on said first memory.

6. A turbo decoder according to claim 5, wherein deciding a random read address as to whether to correspond to a data storage portion on said first memory is made by deciding whether said random read address exceeds a bit number resulting from subtraction of tail bits from an information bit number of said data series subject to error correction decoding.

7. A turbo decoder comprising:
an error correction decoding unit for performing error correction decoding of an inputted data series;
a first memory to which the data series subjected to error correction coding by said error correction decoding unit is written; and
an address generator for supplying, when writing said data series undergoing error correction decoding is written to said first memory, write addresses and when said data series written to said first memory is read out of said first memory, supplying random read addresses,
wherein said address generator converts values pursuant to a predetermined rule into said random read addresses and decides whether said random read addresses correspond to data storage portions on said first memory,
wherein said address generator includes:
a plurality of address conversion sections for converting values pursuant to said predetermined rule into said random read addresses;
a correction section for inputting mutually different values pursuant to said predetermined rule to respective ones of said plurality of address conversion sections;
an address monitoring section for deciding whether random read addresses converted by the respective ones of said plurality of address conversion sections correspond to data storage portions on said first memory; and
an address selection section responsive to a decision result by said address monitoring section to select one of random read addresses converted by the respective ones of said plurality of address conversion sections,
whereby the random read address selected by said address selection section is used to randomly read the data series written to said first memory.

8. A turbo decoder according to claim 7, wherein each of said plurality of address conversion sections has priority;
said address selection section selects, from random read addresses so determined by said address monitoring section as to correspond to data storage portions on said first memory, a random read address converted by an address conversion section having higher priority;
said address monitoring section corrects a value inputted to said correction section in accordance with the priority of said address conversion section which has converted said selected random read address; and
said correction section inputs, as values pursuant to said predetermined rule, values resulting from addition of a plurality of mutually different fixed values to said corrected value to the respective ones of said plurality of address conversion sections.

9. A turbo decoder according to claim 8, wherein deciding a random read address as to whether to correspond to a data storage portion on said first memory is made by deciding whether said random read address exceeds a bit number resulting from subtraction of tail bits from an information bit number of said data series subject to error correction decoding.

10. A turbo decoder according to claim 7, wherein deciding a random read address as to whether to correspond to a data storage portion on said first memory is made by deciding whether said random read address exceeds a bit number resulting from subtraction of tail bits from an information bit number of said data series subject to error correction decoding.

11. A turbo decoder comprising:
an error correction decoding unit for performing error correction decoding of an inputted data series;
a first memory to which the data series subjected to error correction coding by said error correction decoding unit is written; and
an address generator for supplying, when writing said data series undergoing error correction decoding is written to said first memory, write addresses and when said data series written to said first memory is read out of said first memory, supplying random read addresses,
wherein said address generator converts values pursuant to a predetermined rule into said random read addresses and decides whether said random read addresses correspond to data storage portions on said first memory,
wherein said address generator includes:
an address conversion section for converting values pursuant to said predetermined rule into random read addresses;
an address monitoring section for deciding whether said random read addresses converted by said address conversion section correspond to data storage portions on said first memory; and
an address control section responsive to a decision result by said address monitor section to control reading of the data series written to said first memory so as to cause it to stop temporarily and processing of a peripheral circuit of said first memory so as to cause it to stop temporarily.

12. A turbo decoder according to claim 11, wherein when said decision result indicates that said random read addresses correspond to data storage portions on said first memory, said address control section uses said random read addresses to control reading of the data series written to said first memory, and when a random read address does not correspond to any data storage portion on said first memory, said address control section stops delivering said random read address and uses a random read address delivered immediately before said random read address to control reading of the data series written to said first memory.

13. A turbo decoder according to claim 12, wherein deciding a random read access address as to whether to correspond to a data storage portion on said first memory is made by deciding whether said random read address exceeds a bit number resulting from subtraction of tail bits from an information bit number of said data series subject to error correction decoding.

14. A turbo decoder according to claim 11, wherein deciding a random read access address as to whether to correspond to a data storage portion on said first memory is made by deciding whether said random read address exceeds a bit number resulting from subtraction of tail bits from an information bit number of said data series subject to error correction decoding.

15. A turbo decoder comprising:
an error correction decoding unit for performing error correction decoding of an inputted data series;
a first memory to which the data series subjected to error correction coding by said error correction decoding unit is written; and
an address generator for supplying, when writing said data series undergoing error correction decoding is written to said first memory, write addresses and when said data series written to said first memory is read out of said first memory, supplying random read addresses,
wherein said address generator converts values pursuant to a predetermined rule into said random read addresses and decides whether said random read addresses correspond to data storage portions on said first memory, and
wherein deciding a random read address as to whether to correspond to a data storage portion on said first memory is made by deciding whether said random read address exceeds a bit number resulting from subtraction of tail bits from an information bit number of said data series subject to error correction decoding.

16. A radio base station comprising:
an antenna;
a radio frequency processing unit connected to said antenna;
a baseband unit connected to said radio frequency processing unit; and
a communication interface for providing interface between said baseband unit and a communication network, wherein:
said baseband unit includes a turbo decoder for decoding coded data,
said turbo decoder includes:
an error correction decoding unit for performing error correction decoding of data series inputted through said radio frequency processing unit,
a first memory written with the data series subjected to error correction decoding by said error correction decoding unit, and
an address generator for supplying write addresses when said data series undergoing error correction decoding is written to said first memory and supplying random read addresses when the data series written to said first memory is read out of said first memory at random,
said address generator being adapted to convert values pursuant to a predetermined rule into said random read addresses and being operative to decide whether said random read addresses correspond to data storage portions on said first memory.

17. A radio base station according to claim 16, wherein said address generator includes:
an address conversion section for converting values pursuant to said predetermined rule into said random read addresses;
a second memory for storing the random read addresses converted by said address conversion section; and
an address control section for controlling writing of said converted random read addresses to said second memory or reading of said random read addresses from said second memory,
whereby when the decision result indicates that a random read address does not correspond to any data storage portion on said first memory, said address control section overwrites said random read address which has already been written to said second memory with a random read address converted immediately subsequently to said random read address.

18. A radio base station according to claim 17, wherein deciding a random read address as to whether to correspond to a data storage portion on said first memory is made by deciding whether said random read address exceeds a bit number resulting from subtraction of tail bits from an information bit number of said data series subject to error correction decoding.

19. A radio base station according to claim 16, wherein said address generator includes:
   a plurality of address conversion sections for converting values pursuant to said predetermined rule into said random read addresses;
   a correction section for inputting mutually different values pursuant to said predetermined rule to respective ones of said plurality of address conversion sections;
   an address monitoring section for deciding whether random read addresses converted by the respective ones of said plurality of address conversion sections correspond to data storage portions on said first memory; and
   an address selection section responsive to the decision result by said address monitoring section to select, from the random read addresses converted by the respective ones of said plurality of address conversion sections, one random read address,
   whereby the random read address selected by said address selection section is used to randomly read the data series written to said first memory.

20. A radio base station according to claim 19, wherein deciding a random mad address as to whether to correspond to a data storage portion on said first memory is made by deciding whether said random read address exceeds a bit number resulting from subtraction of tail bits from an information bit number of said data series subject to error correction decoding.

21. A radio base station according to claim 16, wherein said address generator includes:
   an address conversion section for converting values pursuant to a predetermined rule into said random read addresses;
   an address monitoring section for deciding whether said random read addresses converted by said address conversion section correspond to data storage portions on said first memory; and
   an address control section responsive to the decision result by said address monitoring section to control reading of the data series written to said first memory so as to cause it to stop temporarily and processing of a peripheral circuit of said first memory so as to cause it to stop temporarily.

22. A radio base station according to claim 21, wherein deciding a random read address as to whether to correspond to a data storage portion on said first memory is made by deciding whether said random read address exceeds a bit number resulting from subtraction of tail bits from an information bit number of said data series subject to error correction decoding.

23. A radio base station according to claim 16, wherein deciding a random read address as to whether to correspond to a data storage portion on said first memory is made by deciding whether said random read address exceeds a bit number resulting from subtraction of tail bits from an information bit number of said data series subject to error correction decoding.

24. A turbo encoder comprising:
   a first memory to which transmission data is written;
   an address generator for supplying write addresses when said transmission data is written to said first memory and supplying random read addresses when said transmission data written to said first memory is randomly read out of said first memory; and
   a convolutional encoder for performing convolutional coding of said transmission data read out of said first memory at random by means of said address generation unit,
   said address generator being adapted to convert values pursuant to a predetermined rule into said random read addresses and being operative to decide whether said random read addresses correspond to data storage portions on said first memory.

25. A turbo encoder according to claim 24, wherein said address generator includes:
   an address conversion section for converting values pursuant to said predetermined rule into said random read addresses;
   a second memory for storing the random read addresses converted by said address conversion section; and
   an address control section for controlling write of said converted random read addresses to said second memory or mad of said random read addresses from said second memory,
   whereby when the decision result indicates that a random read address does not correspond to any data storage portion on said first memory, said address control section overwrites said random read address which has already been written to said second memory with a random read address converted immediately subsequently to said random read address.

26. A turbo encoder according to claim 24, wherein said address generator includes:
   a plurality of address conversion sections for converting values pursuant to said predetermined rule into said random read addresses;
   a correction section for inputting mutually different values pursuant to said predetermined rule to respective ones of said plurality of address conversion sections;
   an address monitoring section for deciding whether random read addresses converted by the respective ones of said plurality of address conversion sections correspond to data storage portions on said first memory; and
   an address selection section responsive to the decision result by said address monitoring section to select, from the random read addresses converted by the respective ones of said plurality of address conversion sections, one random read address,
   whereby the random read address selected by said address selection section is used to randomly read transmission data written to said first memory.

27. A turbo encoder according to claim 24, wherein said address generator includes:
   an address conversion section for converting values pursuant to said predetermined rule into said random read addresses;
   an address monitoring section for deciding whether said random read addresses converted by said address conversion section correspond to data storage portions on said first memory; and
   an address control section responsive to the decision result by said address monitoring section to control reading of said transmission data written to said first memory so as to cause it to stop temporarily and processing of a peripheral circuit of said first memory so as to cause it to stop temporarily.

28. A radio base station having a communication interface for providing interface to a communication network, a baseband unit connected to said communication interface, a radio frequency processing unit connected to said baseband unit and an antenna connected to said radio frequency processing unit, wherein said baseband unit comprises a turbo encoder for coding transmission data transmitted through said communication interface, said turbo encoder including:

a first memory to which said transmission data is written;

an address generator for supplying write addresses when said transmission data is written to said first memory and supplying random read addresses when said transmission data written to said first memory is randomly read out of said first memory; and a convolutional encoder for performing convolutional coding of the transmission data read out of said first memory at random by said address generator, said address generator being adapted to convert values pursuant to said predetermined rule into said random read addresses and being operative to decide whether said random read addresses correspond to data storage portions on said first memory.

\* \* \* \* \*